(12) United States Patent
Isa

(10) Patent No.: US 7,838,328 B2
(45) Date of Patent: Nov. 23, 2010

(54) METHOD FOR MANUFACTURING SEMICONDUCTOR DEVICE

(75) Inventor: Toshiyuki Isa, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 63 days.

(21) Appl. No.: 12/197,482

(22) Filed: Aug. 25, 2008

(65) Prior Publication Data

US 2009/0061721 A1    Mar. 5, 2009

(30) Foreign Application Priority Data

Aug. 30, 2007   (JP) .............................. 2007-224043

(51) Int. Cl.
 *H01L 51/40* (2006.01)
(52) U.S. Cl. .................. 438/99; 438/404; 438/685; 257/E51.024; 257/21.211
(58) Field of Classification Search .................. 438/99, 438/404, 685; 257/E51.024, E21.211; 313/505
See application file for complete search history.

(56) References Cited

U.S. PATENT DOCUMENTS

| | | | |
|---|---|---|---|
| 5,757,456 A | 5/1998 | Yamazaki et al. | |
| 5,821,138 A | 10/1998 | Yamazaki et al. | |
| 6,118,502 A | 9/2000 | Yamazaki et al. | |
| 6,376,333 B1 | 4/2002 | Yamazaki et al. | |
| 6,489,659 B2 * | 12/2002 | Chakrabarti et al. | 257/460 |
| 6,998,282 B1 | 2/2006 | Yamazaki et al. | |
| 7,050,138 B1 | 5/2006 | Yamazaki et al. | |
| 7,361,519 B2 | 4/2008 | Yamazaki et al. | |
| 7,375,782 B2 | 5/2008 | Yamazaki et al. | |
| 2001/0055854 A1* | 12/2001 | Nishida et al. | 438/455 |
| 2003/0032210 A1 | 2/2003 | Takayama et al. | |
| 2003/0071953 A1 | 4/2003 | Yamazaki et al. | |
| 2005/0070038 A1 | 3/2005 | Yamazaki et al. | |
| 2006/0079039 A1 | 4/2006 | Ohtani et al. | |
| 2007/0259585 A1 | 11/2007 | Yamazaki et al. | |
| 2008/0073746 A1* | 3/2008 | Tanaka | 257/510 |
| 2008/0227232 A1* | 9/2008 | Yamazaki et al. | 438/34 |
| 2009/0004772 A1* | 1/2009 | Jinbo et al. | 438/99 |

FOREIGN PATENT DOCUMENTS

| | | |
|---|---|---|
| JP | 08-250745 | 9/1996 |
| JP | 08-288522 | 11/1996 |
| JP | 2003-174153 | 6/2003 |

* cited by examiner

*Primary Examiner*—Phuc T Dang
(74) *Attorney, Agent, or Firm*—Nixon Peabody LLP; Jeffrey L. Costellia

(57) ABSTRACT

A method for manufacturing a semiconductor device having flexibility by separating an element that is manufactured by a comparatively low-temperature (temperature of less than 500° C.) process from a substrate is provided. The element is separated from a glass substrate by the following steps: forming a silicone layer over a glass substrate; performing plasma treatment to the surface of the silicone layer to weaken the surface of the silicone layer; stacking an organic compound layer over the silicone layer; and forming an element that is manufactured through a process at a comparatively low-temperature, typically, a temperature that the organic compound can withstand, over the compound layer.

24 Claims, 20 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device including a thin film transistor, a light-emitting element, a passive element, and the like. Furthermore, the present invention relates to an electro-optical device represented by a liquid crystal display panel, a light-emitting display device that have a light-emitting element, and an electronic device in which an IC tag, by which information can be transmitted and received wirelessly, are mounted as components.

It is to be noted that "a semiconductor device" in the present specification refers to a general device that can function as a semiconductor device using semiconductor characteristics, and an electro-optical device, a light-emitting device, a semiconductor circuit, an IC tag, and an electronic device can all be considered semiconductor devices.

2. Description of the Related Art

In recent years, technology that is used to form a thin film transistor using a thin semiconductor layer (with a thickness of from several nanometers to several hundreds of nanometers, approximately) that are formed over a substrate that have an insulating surface has been attracting attention. A thin film transistor has been widely applied to electronic devices such as an IC and an electro-optical device, and their development especially as a switching element for an image display device has been particularly urgent.

With applications that use such an image display devices, a variety of things are being expected, and use in portable devices is particularly attracting attention. A glass substrates and a quartz substrate are often used in an image display device; however, there are disadvantages to using the glass substrate and the quartz substrate in that they are easily breakable as well as heavy. Furthermore, increasing the size of a glass substrate and a quartz substrate is difficult for mass production, and the glass substrate and the quartz substrate are thus not suitable for mass production. For these reasons, forming a thin film transistor over a flexible substrate, typically, a flexible plastic film, is being attempted.

Thus, technology in which a semiconductor element including a thin film transistor, that are formed over a glass substrate is separated from the glass substrates and transferred to another substrate, for example, to a plastic film or the like, has been proposed.

In Patent Reference Document 1, a separation technique by which a silicon oxide layer that is to be used as a separation layer is removed by wet etching is disclosed. In addition, in Patent Reference Document 2, a separation technique by which a silicon layer that is to be used as a separation layer is removed by dry etching is disclosed.

In Patent Reference Document 3, a technique where a metal (Ti, Al, Ta, W, Mo, Cu, Cr, Nd, Fe, Ni, Co, Ru, Rh, Pd, Os, or Ir) layer is formed over a substrate, an oxide layer is formed and stacked thereover, a metal oxide layer of the metal layer is formed in the interface between the metal layer and the oxide layer, and separation is performed during a subsequent step using this metal oxide layer is disclosed.

Patent Reference Document 1: Published Patent Application No. H8-288522

Patent Reference Document 2: Published Patent Application No. H8-250745

Patent Reference Document 3; Published Patent Application No. 2003-174153

SUMMARY OF THE INVENTION

In the present invention, separation and transfer technique by which an element, typically, a thin film transistor formed using an amorphous semiconductor layer, a crystalline semiconductor layer formed by laser crystallization, or the like; a thin film transistor formed using an organic semiconductor layer; a light-emitting, element; a passive element (a sensor element, an antenna, a resistive element, a capacitive element, and the like); and the like, which are manufactured by a comparatively low-temperature (temperature of less than 500° C.) process, are separated from a glass substrate and transferred to a flexible substrate (typically, a plastic film) is disclosed.

A thin film transistor formed using an amorphous semiconductor layer or the like and a thin film transistor formed using an organic semiconductor layer can be directly formed over a plastic film; however, because the plastic film is soft and curls up easily, there is a need to set the manufacturing equipment to be manufacturing equipment that is used to handle plastic films exclusively.

Furthermore, when a thin film transistor formed using an amorphous semiconductor layer or the like and a thin film transistor formed using an organic semiconductor layer are directly formed over a plastic film, there is a risk that the plastic film will be exposed to a solvent or an etching gas that are used in a thin film transistor manufacturing process and that the quality of the plastic film itself will change. In addition, when a thin film transistor formed using ZnO is directly formed over a plastic film, if the plastic film is irradiated by plasma that are generated by a sputtering method or the like, the plastic film itself will become deformed. Moreover, there is a possibility that moisture or the like will be absorbed into or released from the plastic film in the thin film transistor manufacturing process, resulting in that an element will be contaminated. Additionally, because a plastic film has lower heat resistance and higher degree of heat-induced expansion and contraction as compared to a glass substrate, carefully controlling the process temperature of each step of the manufacturing process is needed.

Moreover, when mass production of a semiconductor device formed using a plastic film is carried out, it is often the case that manufacturing equipment is supplied with a roll-to-roll method. However, with a roll-to-roll method, existing semiconductor manufacturing equipment cannot be used. In addition, the level of accuracy for alignment is low, and microfabrication is difficult. As a result, it is difficult to manufacture a semiconductor device in which characteristics equivalent to those of a conventional semiconductor device formed using a glass substrate is obtained, at a high yield.

An object of the present invention is to provide a method for manufacturing a semiconductor device that is thin and that have an element manufactured through a process at a comparatively low temperature, typically, a temperature that an organic compound can withstand, typically, a thin film transistor formed using an amorphous semiconductor layer, a microcrystal semiconductor layer, or the like; a thin film transistor formed using a crystalline semiconductor layer obtained by laser crystallization; a thin film transistor formed using an organic semiconductor layer; a light-emitting element; a passive element (a sensor element, an antenna, a resistive element, a capacitive element, and the like); and the like. Furthermore, another object of the present invention is to provide a method for manufacturing a semiconductor device that is flexible.

A feature of the present invention is that a silicone layer is formed over a glass substrate; a surface of the silicone layer is subjected to plasma treatment to be weakened; an organic compound layer is stacked over the silicone layer; an element that is manufactured through a process at a comparatively low temperature, typically, a temperature that an organic compound can withstand (a thin film transistor formed using an amorphous semiconductor layer or a microcrystal semiconductor layer, a thin film transistor formed using a crystalline semiconductor layer obtained by laser crystallization, a thin film transistor formed using an organic semiconductor layer, a light-emitting element, a passive element (a sensor element, an antenna, a resistive element, a capacitive element, and the like); and the like) is formed over the organic compound layer; and the element is separated from the glass substrate. The silicone layer is a layer formed of a composition that contains a siloxane polymer; typically, a silicon oxide layer including an organic group.

The composition that contains a siloxane polymer includes a siloxane polymer. In the siloxane polymer, a skeleton structure is formed by a bond of silicon and oxygen, and an organic group is included at least in a substituent. The organic group is at least one kind selected from an alkyl group, an aryl group, a fluoroalkyl group, and a fluoroaryl group. When the siloxane polymer includes a plurality of organic groups, the organic groups may be the same or different. As the alkyl group, a methyl group, an ethyl group, a propyl group, a butyl group, a hexyl group, a decyl group, a fluoromethyl group, a fluoropropyl group, or the like is given, and it may be a chain alkyl group or a branched alkyl group. Furthermore, a hydrogen atom in the alkyl group or the aryl group may be substituted by a fluorine atom. As the aryl group, a phenyl group, a naphthyl group, a methylphenyl group, an ethylphenyl group, a chlorophenyl group, a bromophenyl group, a fluorophenyl group, or the like is given.

Furthermore, a composition that contains a siloxane polymer may include a solvent. As the solvent, hydrocarbon such as toluene, xylene, or hexadecane, alkyl halide such as chloroform, carbon tetrachloride, trichloroethylene, or tetrachloroethylene, alcohol such as methanol ethanol, n-propanol, or isopropanol, ether such as propylene glycol mono-n-propylether, propylene glycol mono-n-butylether, or propylene glycol mono-t-butylether, ester such as methyl acetate, ethyl acetate, butyl acetate, ethyl lactate, or butyl lactate, or the like is given.

A composition that contains a siloxane polymer is applied to a substrate, a solvent is heated to be volatilized, and crosslinking reaction of low molecular ingredients in the siloxane polymer proceeds, thereby forming a silicone layer.

Subsequently, the surface of the silicone layer is subjected to plasma treatment to form a brittle layer. As the plasma treatment, oxygen plasma treatment, hydrogen plasma treatment, nitrogen plasma treatment, dinitrogen monoxide plasma treatment, nitrogen dioxide plasma treatment, halogen plasma treatment, rare gas plasma treatment using neon, argon, or the like, and the like are given. By performing the plasma treatment to the surface of the silicone layer, the organic group in the surface of the silicone layer, typically, at least one kind selected from an alkyl group, an aryl group, a fluoroalkyl group, and a fluoroaryl group is oxidized, whereby a brittle layer containing silicon oxide is formed.

In this invention, separation is performed in the vicinity of the layer which is weakened. Typically, in a stacked structure of a silicone layer, a weakened layer, and an organic compound layer, separation can be performed in the vicinity of the layer which is weakened, and the separation can be performed at a high yield even if a comparatively large substrate is used.

In addition, in separating elements (light-emitting elements, organic thin film transistors, and the like) that each include an organic compound and are formed over a silicone layer that is provided over a glass substrate, because the adhesiveness of the organic compound layer included in each of the light-emitting elements, organic thin film transistors, and the like is weak, separation occurs not in the vicinity of the silicone layer but within the organic compound layer or at an interface of the organic compound layer and the silicon layer, and the elements each containing an organic compound may break. Furthermore, because the adhesiveness of a layer formed by a printing method is weak, separation may occur, as with the above, either within the layer or at the interface of the layers. However, in a case of employing a separation method of the present invention that uses a silicone layer, by performing plasma treatment to the surface of the silicone layer, a weakened layer can be formed on the surface of the silicone layer, so that, separation can be performed in the vicinity of the silicon layer with relatively small force.

It is to be noted that the silicone layer is to be formed over a glass substrate; however, the substrate that is used is not limited to a glass substrate, and a quartz substrate, a ceramic substrate, a semiconductor substrate, or the like can be used, as well.

In the present invention, after elements such as thin film transistors and the like are formed using existing manufacturing equipment for a large glass substrate, the elements can be separated. Therefore, equipment cost can be significantly reduced.

In addition, by formation of an organic compound layer at a thickness of 5 μm or more, preferably, at a thickness from 10 μm to 100 μm, between a silicone layer and a semiconductor element, the organic compound layer can be made to function as a support of a semiconductor device that is to be formed later.

Moreover, with regard to a thin film transistor, the present invention can be applied to regardless of an element structure, and, for example, a top-gate thin film transistor, a bottom-gate (inverted-staggered) thin film transistor, and a staggered thin film transistor can be used. The transistor is not limited to a single-gate transistor, and may be a multi-gate transistor having a plurality of channel formation regions, such as a double-gate transistor.

Furthermore, according to the present invention, a display device that is flexible, thin, and large can be manufactured, and the display device is not limited to a passive matrix liquid crystal display device or a passive matrix light-emitting device; an active matrix liquid crystal display device or an active matrix display device can be manufactured, as well.

Additionally, the flexible substrate refers to a plastic substrate that is formed as a film, for example, a plastic substrate made from polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or the like.

By the present invention, a separation process can be performed smoothly even if a substrate with a large area, where the length of the diagonal of the substrate exceeds 1 meter, is used. In addition, by provision of an organic compound layer between a brittle layer and a semiconductor element formed over a silicone layer, the organic compound layer can be made to function as a support for the semiconductor device. For this reason, a support substrate used to support the semiconductor device need not be formed unnecessarily, and cost can be reduced.

DETAILED DESCRIPTION OF THE INVENTION

Embodiment Mode

Figure 1A:
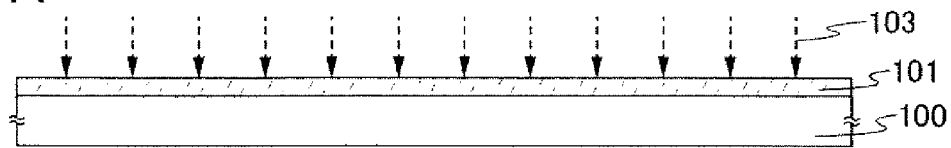
FIGS. 1A to 1E are cross-sectional views illustrating a method for manufacturing a semiconductor device of the present invention.

Hereinafter, embodiment modes of the invention are described with reference to the drawings. However, the present invention can be implemented in various different modes, and it will be easily appreciated by those skilled in the art that various changes and modifications of the modes and details are possible, unless such changes and modifications depart from the content and the scope of the invention. Thus, the present invention is not interpreted while limiting to the following description of the embodiment modes. In the following description, like reference numerals are used to designate identical portions or portions having a similar function in different drawings for illustrating embodiment modes, and thus their repetitive description will be omitted.

Embodiment Mode 1

Here, an example in which a liquid crystal display device is manufactured will be described with reference to FIGS. 1A to 1E.

A silicone layer 101 is formed over a substrate 100. A glass substrate is used as the substrate 100. The silicone layer 101 is formed by applying a composition containing a siloxane polymer, and baking and drying the composition. The thickness of the silicone layer 101 is from 1 nm to 2000 nm, preferably, from 1 nm to 1000 nm.

Subsequently, the surface of the silicone layer 101 is subjected to plasma treatment to form a brittle layer. As the plasma treatment, oxygen plasma treatment, hydrogen plasma treatment, nitrogen plasma treatment, dinitrogen monoxide plasma treatment, nitrogen dioxide plasma treatment, halogen plasma treatment, rare gas plasma treatment using neon, argon, or the like, or the like are given. By performing plasma treatment 103 to the surface of the silicone layer, an organic group in the surface of the silicone layer is oxidized, so that a brittle layer 102 containing silicon oxide is formed (see FIG. 1B).

The brittle layer 102 is a layer in which an organic group in the surface of the silicone layer is oxidized and decomposed by the plasma treatment to the silicone layer 101. Therefore, the brittle layer 102 is a non-dense layer and may be a porous layer in some cases; thus, brittle fracture easily occurs by the external force.

Subsequently, an organic compound layer 104 is formed over the brittle layer 102. It is preferable that the organic compound layer 104 be formed of a material that has a high enough upper temperature limit to withstand a process temperature (a temperature of from 180° C. to 500° C., preferably, from 200° C. to 400° C., more preferably, from 250° C. to 350° C.) of a later process to be performed. Furthermore, it is preferable that the organic compound layer 104 be formed of a flexible material that is resistant to bending and in which cracks do not easily form. In addition, it is preferable that the organic compound layer 104 be formed of a material that transmits light.

With the organic compound layer 104 being able to transmit light, a transmissive liquid crystal display device can be manufactured. By formation of the organic compound layer 104 at a thickness of 5 μm or more, preferably, at a thickness of from 10 μm to 100 μm, the organic compound layer 104 can be made to function as a support for a semiconductor device that is to be formed in a later step. For this reason, a support substrate used to support the semiconductor device need not be formed unnecessarily. In a manufacturing method for the organic compound layer 104, a composition is applied to the brittle layer 102, and baked at a temperature of from 180° C. to 500° C., preferably, at a temperature of from 200° C. to 400° C., and even more preferably, at a temperature of from 250° C. to 350° C. The representative examples of the organic compound layer 104 are polyimide, polybenzoxazole, siloxane polymer, and the like.

An inorganic insulating layer may be formed between the brittle layer 102 and the organic compound layer 104. The inorganic insulating layer can be formed of silicon nitride, silicon oxide, silicon oxynitride, silicon nitride oxide, aluminum oxide, aluminum nitride, aluminum oxynitride, aluminum nitride oxide, or the like. By forming the inorganic insulating layer using silicon nitride or silicon nitride oxide, moisture intrusion into the organic compound layer 104 from the outside can be prevented, and deterioration of an element included in an element layer can be prevented.

Next, an inorganic insulating layer 105 may be formed over the organic compound layer 104. The inorganic insulating layer 105 functions as a base insulating layer used to suppress mixing of impurities from the glass substrate or the organic compound into a semiconductor layer that is to be formed in a subsequent step, and is formed as needed. The inorganic insulating layer 105 can be formed of silicon nitride oxide, aluminum oxide, aluminum nitride, aluminum oxynitride, aluminum nitride oxide, or the like. As a typical example of a layer that functions as a base insulating layer, the inorganic insulating layer 105 has a two-layer structure in which a silicon nitride oxide layer formed at a thickness of from 50 nm to 100 nm by a plasma CVD method with $SiH_4$, $NH_3$, and $N_2O$ used as reactive gases and a silicon oxynitride layer formed at a thickness of from 100 nm to 150 nm with $SiH_4$ and $N_2O$ used as reactive gases are stacked.

Next, a first conductive layer is formed over the inorganic insulating layer 105, and a mask is formed over the first conductive layer. The first conductive layer is formed of a single layer of an element selected from Ta, W, Ti, Al, Cu, Cr, Nd, Mo and the like or an alloy material or a compound material including one of these elements as the main component, or formed of a stacked layer of any of these. In addition, for a formation method of the first conductive layer, a sputtering method, an evaporation method, a CVD method, a coating method, or the like is used, as appropriate. Next, the first conductive layer is etched using the mask, and a gate electrode 106 is formed.

Next, a gate insulating layer 107 is formed over the gate electrode 106. As the gate insulating layer 107, an insulating layer such as a silicon oxide layer, a silicon nitride layer, a silicon oxynitride layer, or a silicon nitride oxide layer is used. Alternatively, a layer obtained by applying and baking of a composition that contains a siloxane polymer, a light-curable organic resin layer, a thermosetting organic resin layer, or the like may be used, as well.

Then, a microcrystalline semiconductor layer 108a is formed over the gate insulating layer 107. The microcrystalline semiconductor layer 108a is a layer including a semiconductor having an intermediate structure between amorphous and crystalline (including single-crystalline and polycrystalline) structures. This semiconductor has a third state in which the semiconductor is stable in terms of free energy, which is a crystalline semiconductor that has short range order and lattice distortion, in which columnar or needle-like crystals with a crystal grain of from 0.5 to 20 nm grows in a normal line direction to a substrate surface. Furthermore, in the microcrystalline semiconductor layer 108a, a microcrystalline semiconductor and an amorphous semiconductor are mixed. The microcrystalline semiconductor layer 108a is formed by a vapor growth method using a semiconductor material gas typified by silane or germane or a sputtering method. At this time, the flow ratio of hydrogen to silane or germane is set to be 12:1 to 1000:1, preferably, 50:1 to 200:1, more preferably, 100:1 to 150:1.

Furthermore, after forming the microcrystalline semiconductor layer over the gate insulating layer 107, the microcrystalline semiconductor layer may be irradiated with a pulsed laser beam to form a microcrystalline semiconductor layer 108a in which crystallinity is improved. When excimer laser is used as the laser beam, the pulse repetition rate is set to be greater than or equal to 1 Hz and less than 10 MHz, preferably from 100 Hz to 10 kHz, and the laser energy density is set in a range of from 0.2 $J/cm^2$ to 0.35 $mJ/cm^2$ (typically from 0.2 $J/cm^2$ to 0.3 $J/cm^2$). When a YAG laser is used as a solid laser, the third harmonic is used; the pulse repetition rate is set to be greater than or equal to 1 Hz and less than 10 MHz, and the laser energy density is set in a range of from 0.2 $J/cm^2$ to 0.35 $mJ/cm^2$ (typically 0.2 $J/cm^2$ to 0.3 $J/cm^2$). In such a microcrystalline semiconductor layer, an amorphous semiconductor component in the layer is reduced, thereby crystallinity is enhanced.

Then, a buffer layer 108b is formed over the microcrystalline semiconductor layer 108a. The buffer layer 108b is an antioxidant layer of the microcrystalline semiconductor layer 108a, and functions as a high-resistance region. Therefore, the buffer layer 108b is formed using an amorphous semiconductor layer. Alternatively, the buffer layer 108b can be formed using an amorphous semiconductor layer including nitrogen, fluorine, chlorine, bromine, iodine, or the like.

The buffer layer 108b can be formed by a plasma CVD method using silicon hydride such as $SiH_4$, and $Si_2H_6$, or germane. Further, silicon hydride may be diluted with one or more rare gas elements of helium, argon, krypton, and neon, to form the amorphous semiconductor layer. Alternatively, nitrogen, ammonia, a halogen gas, a halogen compound, or the like can be mixed into the silicon hydride to form an amorphous semiconductor layer containing nitrogen, fluorine, chlorine, bromine, or iodine. An amorphous semiconductor layer containing hydrogen can be formed using hydrogen with a flow ratio which is 1 to 10 times, preferably, 1 to 5 times as high as that of silicon hydride. Further, the buffer layer 108b can be formed by a sputtering method.

The buffer layer 108b is formed with a thickness of, typically, from 30 nm to 500 nm, preferably, from 200 nm to 300 nm. In a display device in which a high voltage (e.g., approximately 15V) is applied to a thin film transistor, typically, in a liquid crystal display device, by setting the thickness of the buffer layer 108b large as shown in the above range, the drain withstand voltage is increased, and even when high voltage is applied to the thin film transistor, deterioration of the thin film transistor can be prevented.

Figure 1B:
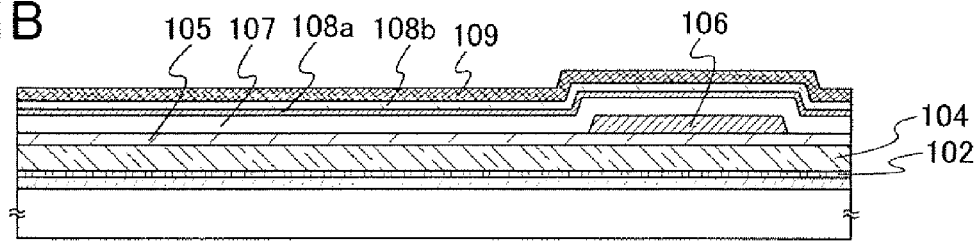

Subsequently, for a semiconductor layer 109 that includes an impurity element imparting one conductivity type, a semiconductor layer 109 that includes an impurity element imparting n-type conductivity is formed at a thickness of from 20 nm to 80 nm. The semiconductor layer 109 that includes an impurity element imparting n-type conductivity is formed over the entire surface by a known disclosed method such as a plasma CVD method, or a sputtering method. A cross-sectional process diagram of what is obtained when the process up to this stage has been completed is shown in FIG. 1B.

Furthermore, instead of using the microcrystalline semiconductor layer 108a, the buffer layer 108b, and the semiconductor layer 109 that includes an impurity element imparting one conductivity type, ZnO or an oxide of zinc-gallium-indium formed by a sputtering method or a pulsed laser deposition (PLD) method may be used; however, in that case, it is preferable that the gate insulating layer be formed of an oxide that contains aluminum or titanium.

Subsequently, an amorphous semiconductor layer 108 and the semiconductor layer 109 that includes an impurity element imparting one conductivity type are etched using a resist mask that is formed using a known photolithography technique, and an island-shaped microcrystalline semiconductor layer 114, an island-shaped buffer layer, and an island-shaped semiconductor layer that contains an impurity element of one conductivity type are obtained. Note that a mask may be formed using a droplet discharge method or a printing method (such as relief printing, planography, intaglio printing, or screen printing) instead of the known photolithography technique and the above-mentioned etching may be performed selectively.

Then, a metal (Ta, W, Ti, Al, Cu, Cr, Nd, Mo or the like) layer is formed by a sputtering method and the metal layer is etched using a resist mask that is formed by a known photolithography technique, thereby forming a source electrode and a drain electrode 112. Here, the metal layer is etched by a wet etching method. Next, instead of this process, a composition that contains a conductive material (silver (Ag), gold (Au), copper (Cu), tungsten (W), aluminum (Al), or the like) may be discharged selectively by a droplet discharge method to form the source electrode and the drain electrode 112.

Then, by using the resist mask which is used for forming the source electrode and the drain electrode 112, the island-shaped semiconductor layer to which an impurity imparting one conductivity type is added is etched to form a pair of source and drain regions 113. At this time, the top portion of the island-shaped buffer layer is etched and a buffer layer 115 in which a concave portion is formed between the source and drain regions 113 is formed. The microcrystalline semiconductor layer 114 functions as a channel formation region of a thin film transistor and the buffer layer 115 functions as a high-resistance region.

Subsequently, a protective layer 117 is formed in order to prevent impurities from contaminating in the channel formation region of the microcrystalline semiconductor layer 114. As the protective layer 117, silicon nitride or a material that contains silicon nitride oxide as its main component obtained by a sputtering method or a plasma CVD method is used. Hydrogenation treatment may be performed after forming the protective layer. In this way, a thin film transistor 111 is manufactured.

Next, an interlayer insulating layer 118 is formed over the protective layer 117. The interlayer insulating layer 118 is formed using a resin material such as an epoxy resin, an acrylic resin, a phenol resin, a novolac resin, a melamine resin, a urethane resin, or a light-transmitting polyimide resin. Furthermore, for the interlayer insulating layer 118, an insulating layer, such as a silicon oxide layer, a silicon nitride layer, or a silicon oxynitride layer can be used, or a stacked layer of any of these insulating layers and the above-mentioned resin material may be used, as well.

Next, the protective layer 117 and the interlayer insulating layer 118 are removed selectively using a mask formed by a known photolithography technique, and a contact hole reaching one of the source electrode and drain electrode 112 is formed.

Then, a metal (Ag, Au, Cu, W, Al, Mo or the like) layer is formed by a sputtering method, the metal layer is etched using a resist mask that is formed by a known photolithography technique, and a first electrode 119 which is electrically connected to the one of the source electrode and drain electrode 112 is formed at the same time as a second electrode 120 which forms an electric field in a direction parallel to the substrate surface with the first electrode 119. It is to be noted that it is preferable that the first electrode 119 and the second electrode 120 be arranged at an equal distance from each other, and the shape of the upper surface of the electrodes may be formed as a comb-like shape. It is to be noted that the first electrode 119 and the second electrode 120 each function as a pixel electrode of a liquid crystal display device. The first electrode 119 and the second electrode 120 may be formed by discharging a composition that contains a conductive material (Ag, Au, Cu, W, Al, Mo or the like) selectively by a droplet discharge method and baking them.

Figure 1C:
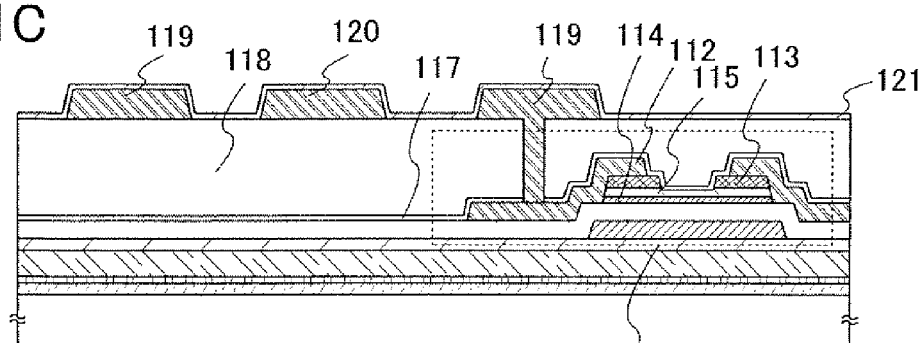

Next, an alignment layer 121 covering the first electrode 119 and the second electrode 120 is formed. FIG. 1C shows a cross-sectional view at a stage where the steps up to here are completed.

Next, a polymer-dispersed liquid crystal is used as a liquid crystal material, and a flexible substrate 133 is fixed to the substrate 100 opposite each other. The polymer-dispersed liquid crystal can be roughly divided into two types depending on the dispersion state of liquid crystals and polymer materials. In one type, droplets of a liquid crystal are dispersed in a polymer material and the liquid crystal is discontinuous (a type called PDLC). In the other type, a polymer material forms a network in the liquid crystal and the liquid crystal is continuous (a type called PNLC). Note that although either type may be used in this embodiment mode, PDLC is used here. In the present embodiment mode, a polymer material 131 that contains liquid crystals 132 is fixed by the flexible substrate 133. If necessary, a sealant may be provided so as to surround the polymer material 131. Furthermore, if necessary, a spacer material (a bead spacer, a columnar spacer, a fiber, or the like) may be used to control the thickness of the polymer material 131. Moreover, a known liquid crystal material may be used instead of the polymer-dispersed liquid crystal.

Figure 1D:
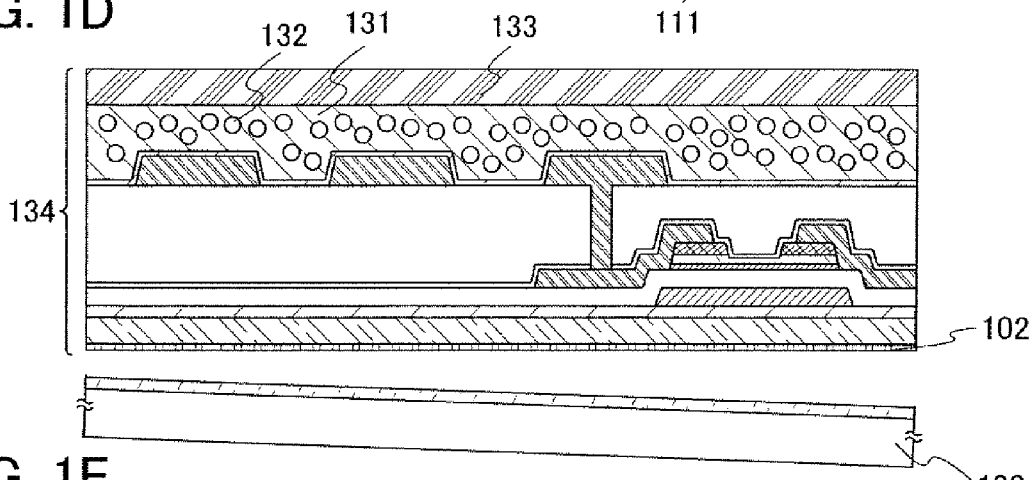

Subsequently, a stacked body 134 that includes the organic compound layer 104, the thin film transistor 111, and the flexible substrate 133 is separated from the substrate 100. Because the brittle layer 102 is weak, separation can be performed with relatively small force. FIG. 1D shows that the stacked body 134 is separated from the substrate 100 at the interface between the brittle layer 102 and the silicone layer 101; however, there are no particular limitations on the place where the stacked body 134 is separated from the substrate 100 as long as the separation is performed in a region where the thin film transistor receives no damage and somewhere between the brittle layer 102 and the substrate 100. For example, the stacked body 134 may be separated from the substrate 100 within the brittle layer 102, or at the interface between the brittle layer 102 and the organic compound layer 104.

It is to be noted that, when a plurality of liquid crystal display devices is included in a stacked body that includes the organic compound layer 104, the thin film transistor 111, and the flexible substrate 133, the stacked body may be divided up and the plurality of liquid crystal display devices may be cut apart. By such a process, a plurality of liquid crystal display devices can be manufactured by a single separation step.

Figure 1E:
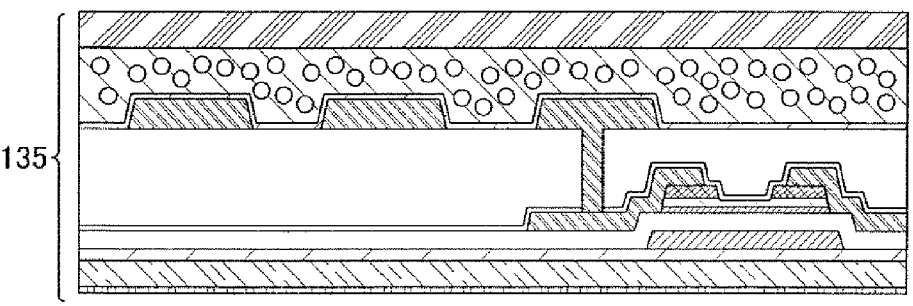

Through the above-described steps, as shown in FIG. 1E, an active matrix liquid crystal display device 135 having a thin film transistor in which a microcrystalline semiconductor layer is used in a channel formation region can be manufactured. The adhesiveness of a conductive layer formed by a droplet discharge method is weak; however, when the separation method in this embodiment mode using a brittle layer formed on a silicone layer is used, even if a conductive layer formed by the droplet discharge method is used for a part of wirings, separation can be performed in the vicinity of the brittle layer (in this embodiment, at the interface between the silicone layer 101 and the brittle layer 102). The liquid crystal display device of this embodiment mode is thin and flexible. In addition, by provision of an organic compound layer between the silicone layer and the thin film transistor, the organic compound layer can be made to function as a support of the liquid crystal display device. For this reason, a support substrate used to support the liquid crystal display device need not be formed unnecessarily, and cost can be reduced.

The brittle layer 102 at the surface of the liquid crystal display device 135 may be removed. Furthermore, when the mechanical strength of the liquid crystal display device is low, the flexible substrate may be fixed to the surface at which separation is performed, using an adhesive layer. In that case, in order to keep a space between substrates irrespective of changes in temperature, it is preferable that a flexible substrate with the same coefficient of thermal expansion as the flexible substrate 133 be used.

An electrophoretic display may be manufactured by using electronic ink instead of the polymer-dispersed liquid crystal. In this case, after the first electrode 119 and the second electrode 120 are formed, electronic ink may be applied by a printing method and then baked, and may subsequently be fixed by the flexible substrate 133. Then, after separating the substrate, another flexible substrate may be used for sealing.

Embodiment Mode 2

Here, description is made on an example in which an active matrix light-emitting device that uses an organic thin film transistor is manufactured with reference to FIGS. 2A to 2D.

Figure 2A:
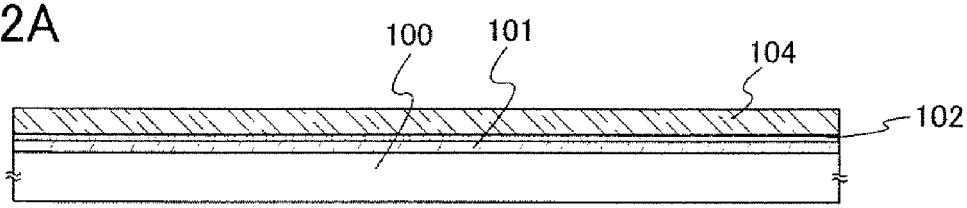
FIGS. 2A to 2D are cross-sectional views illustrating a method for manufacturing a semiconductor device of the present invention.

In the same manner as Embodiment Mode 1, a silicone layer 101 is formed over a substrate 100, and the surface of the silicone layer 101 is subjected to plasma treatment to form a brittle layer 102. Then, an organic compound layer 104 is formed over the brittle layer 102. A cross-sectional process diagram of what is obtained when the process up to this stage has been completed is shown in FIG. 2A. Note that an inorganic insulating layer may be formed between the brittle layer 102 and the organic compound layer 104.

Next, an inorganic insulating layer 105 may be formed over the organic compound layer 104. Subsequently, a conductive layer 211 that is to be used as a gate electrode is formed over the organic conductive layer and the inorganic insulating layer 105. The conductive layer 211 may be formed of any material as long as it is a metal which comes to have an insulating property by nitridation and/or oxidation. The conductive layer 211 may be formed of any material as long as it is a metal which comes to have an insulating property by nitridation and/or oxidation. In particular, tantalum, niobium, aluminum, copper, or titanium is preferable. Besides, tungsten, chromium, nickel, cobalt, magnesium, molybdenum, or the like can also be used. A method for forming the conductive layer 211 is not particularly limited; the conductive layer 211 may be formed by a method in which, after a conductive layer is formed by a sputtering method, an evaporation method, or the like, the conductive layer is processed into a desired shape by etching or the like. In addition, the conductive layer may be formed by using a droplet including a conductive substance by an inkjet method or the like.

Next, a gate insulating layer 212 made of an oxide, a nitride, or an oxynitride of one of the above metals by nitridation and/or oxidation of the conductive layer 211 is formed. It is to be noted that a part of the conductive layer 211 other than the gate insulating layer 212 made to be insulative, functions as a gate electrode.

Subsequently, a semiconductor layer 213 for covering the gate insulating layer 212 is formed. For an organic semiconductor material used to form the semiconductor layer 213, either a low-molecular weight material or a high-molecular weight material can be used as long as it is an organic material that has carrier transporting property, and in which carrier density can be changed by electric field effect, and the kind thereof is not particularly limited. Specifically, the following types can be used: polycyclic aromatic compounds, conjugated double bond compounds, metal phthatocyanine complexes, charge-transfer complexes, condensed ring tetracarboxylic acid diimides, oligothiophenes, fullerenes, carbon nanotubes, or the like. For example, polypyrrole, polythiophene, poly(3-alkylthiophene), polyphenylenevinylene, polyp-phenylenevinylene), polyaniline, polydiacetylene, polyazulene, polypyrene, polycarbazole, polyselenophene, polyfuran, polyp-phenylene), polyindole, polypyridazine, naphthacene, hexacene, heptacene, pyrene, chrysene, pervlene, coronene, Terrylene, ovalene, quaterrylene, circumanthracene, triphenodioxazine, triphenodithiazine, hexacene-6, 15-quinone, polyvinyl carbazole, polyphenylene sulfide, polyvinylene sulfide, polyvinylpyridine, naphthalene tetracarboxylic acid diimide, anthracene tetracarboxylic acid diimide, C60, C70, C76, C78, or C84, and derivatives of any of these can be used. In addition, specific examples thereof are tetracene, pentacene, sexithiophene (6T), copper phthalocyanine, bis-(1,2,5-thiadiazolo)-p-quinobis(1,3-dithiole), rubrene, poly(2,5-thienylene vinylene) (PTV), poly(3-hexylthiophene-2,5-diyl) (P3HT), and poly(9,9'-dioctyl-fluorene-co-bithiophene)(F8T2), which are generally referred to as p-type semiconductors; 7,7,8,8-tetracyanoquinodimethane (TCNQ), 3,4,9,10-perylenetetracarboxylic dianhydride (PTCDA), 1,4,5,8-naphthalenetetracarboxylic dianhydride (NTCDA), N,N'-dioctyl-3,4,9,10-perylenetetracarboxylic diimide (PTCDI-C8H), copper hexadecafluorophthalocyanine ($F_{16}$CuPc), N,N'-(2,2,3,3,4,4,5,5,6,6,7,7,8,8,8-pentadecafluorooctyl)-1,4,5,8-naphthalenetetracarbox ylic diimide (NTCDI-C8F), and 3',4'-dibutyl-5,5"-bis(dicyanomethylene)-5,5"-dihydro-2,2':5',2"-terthiophene) (DCMT), methanofullerene[6,6]-phenyl $C_{61}$ butyric acid methyl ester (PCBM), which are generally referred to as n-type semiconductors; and the like. Note that the property of p-type or n-type of organic semiconductors is not inherent characteristics of the substances themselves but depend on the relationship between the substance and an electrode from which carriers are injected or the strength of the electric field when carriers are injected, and semiconductor materials tend to assume either p-type or n-type conductivity but can be used as either one. In this embodiment mode, a p-type semiconductor is preferable than to an n-type semiconductor.

These organic semiconductor materials can be formed by a method such as an evaporation method, a spin coating method, or a droplet discharge method.

Next, a buffer layer 214 is formed over the semiconductor layer 213 in order to improve adhesiveness and chemical stability at an interface. The buffer layer 214 may be formed using a conductive organic material (an organic compound having an electron accepting property such as 7,7,8,8-tetracyanoquinodimethane (TCNQ), 2,3,5,6-tetrafluoro-7,7,8,8-tetracyanoquinodimethane ($F_4$-TCNQ), or the like) or a composite material of an organic compound and metal oxide. It is to be noted that the buffer layer 214 may be omitted if unnecessary.

Next, a source electrode and a drain electrode 215 is formed over the buffer layer 214. There are no particular limitations on the material used for the source electrode and drain electrode 215, and a metal such as gold, platinum, aluminum, tungsten, titanium, copper, tantalum, niobium, chromium, nickel, cobalt, magnesium, or the like or an alloy that contains any of these metals can be used. In addition, for other materials that can be used for the source electrode and drain electrode 215, a conductive polymer compound such as polyaniline, polypyrrole, polythiophene, polyacetylene, polydiacetylene, or the like can be given. It is to be noted that there are no limitations on the formation method of the source electrode and drain electrode 215 as long as it is a method with which the semiconductor layer 213 is not decomposed, and the source electrode and drain electrode 215 may be formed by forming a layer by a sputtering method, an evaporation method, or the like and then processing the layer into a desired shape by etching or the like. Through the above steps, an organic thin film transistor 227 can be manufactured.

A film of an organic insulating material such as polyimide, polyamic acid, or polyvinyl phenyl may be formed in contact with a lower surface of the semiconductor layer 213. By such a structure, orientation of the organic semiconductor material can be improved further, and the adhesiveness between the gate insulating layer 212 and the semiconductor layer 213 can be improved further.

Subsequently, a method for manufacturing a light-emitting device using the organic thin film transistor 227 is described below.

An interlayer insulating layer 228 is formed to cover the organic thin film transistor 227. Then, the interlayer insulating layer 228 is etched selectively, and a contact hole that reaches one of the source electrode and drain electrode 215 is formed. Next, a first electrode 210 that is electrically connected to the one of source electrode and drain electrode 215 is formed. Then, a partition wall 221 is formed to cover an edge of the first electrode 210. The partition wall 221 is formed using an insulating material and has a function of providing insulation between a plurality of the first electrodes 210 that are arranged adjacent to each other.

Next, a light-emitting layer 222 is formed over a region of the first electrode 210 that does not come into contact with the partition wall 221. In many cases, the light-emitting layer 222 is formed using a single layer or a stacked layer of an organic compound or a single layer or a stacked layer of an inorganic compound. However, in this specification, it is also considered that an inorganic compound is used for a part of a layer made of an organic compound. There is no limitation on a stacking method of layers in a light-emitting element. As long as layers can be stacked, any kind of technique such as a vacuum vapor deposition method, a spin coating method, an inkjet method, a dip coating method, or the like may be selected.

Next, a second electrode 223 is formed over the light-emitting layer 222. A light-emitting element is formed at a place where the first electrode 210, the second electrode 223, and the light-emitting layer 222 overlap with each other. Note that this light-emitting element includes an anode, a cathode, and a layer containing an organic compound or a layer containing an inorganic compound, which generates electroluminescence by application of an electric field (hereinafter referred to as a light-emitting layer). Each of an inorganic EL element using a thin inorganic layer of ZnS:Mn or the like, and an organic EL element using a thin organic layer formed by evaporation is particularly bright, shows high-efficiency electroluminescence, and is suitable for application to a display. Note that there is no particular limitation on the structure of the light-emitting element.

Next, a protective layer 224 is formed over the second electrode 223. The protective layer 224 may be omitted if not necessary.

Figure 2B:
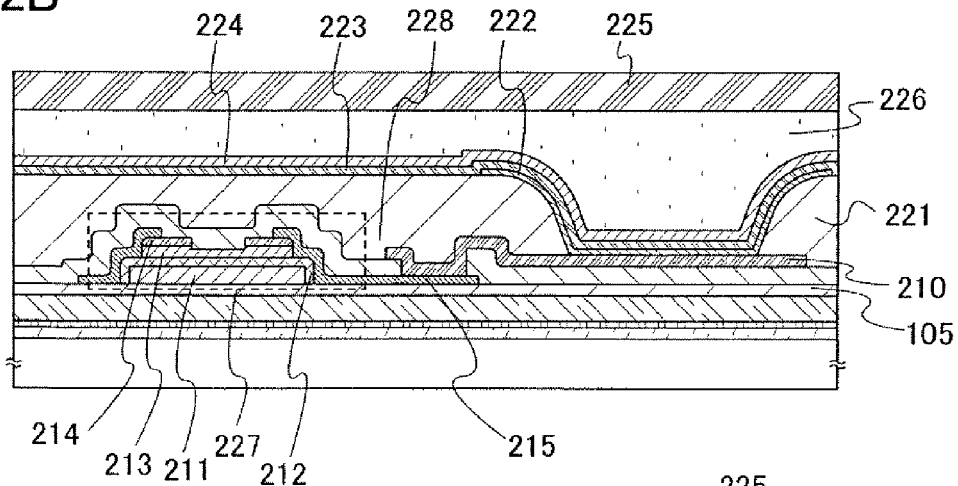

Next, a flexible substrate 225 is fixed over the protective layer 224 by an adhesive layer 226. A sealant may be placed so as to surround the adhesive layer 226 in order to strengthen sealing. FIG. 2B shows a cross-sectional view at a stage where the steps up to here are completed.

Figure 2C:
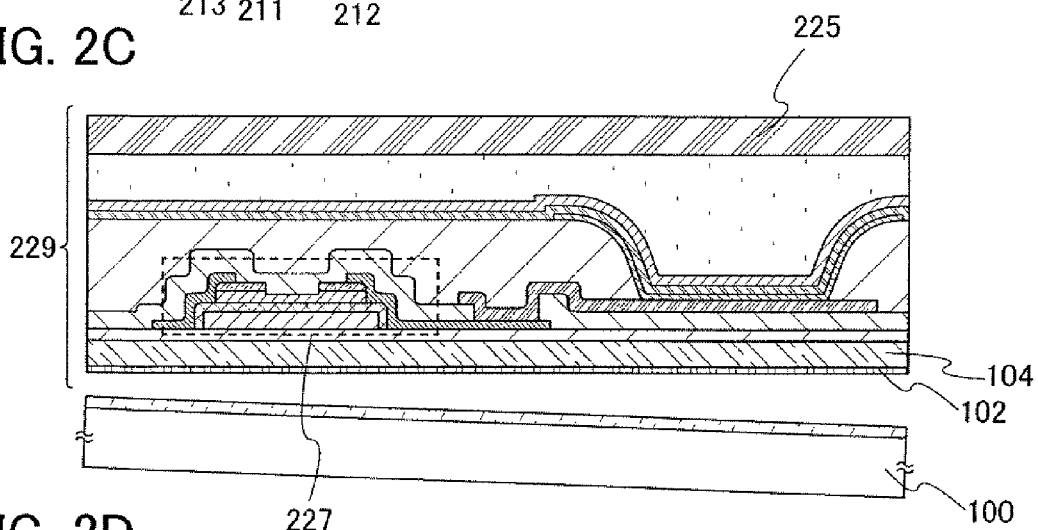

Next, a stacked body 229 that includes the organic compound layer 104, the organic thin film transistor 227, the light-emitting element, and the flexible substrate 225 is separated from the substrate 100. FIG. 2C shows a drawing where the stacked body 229 is separated from the substrate 100 at the interface between the silicone layer 101 and the brittle layer 102.

It is to be noted that, when a plurality of light-emitting devices is included in the stacked body 229 that includes the organic compound layer 104, the organic thin film transistor 227, and the flexible substrate 225, the stacked body 229 may be divided up and the plurality of light-emitting devices may be cut apart. By such steps, a plurality of light-emitting devices 230 can be manufactured by a single separation step.

Figure 2D:
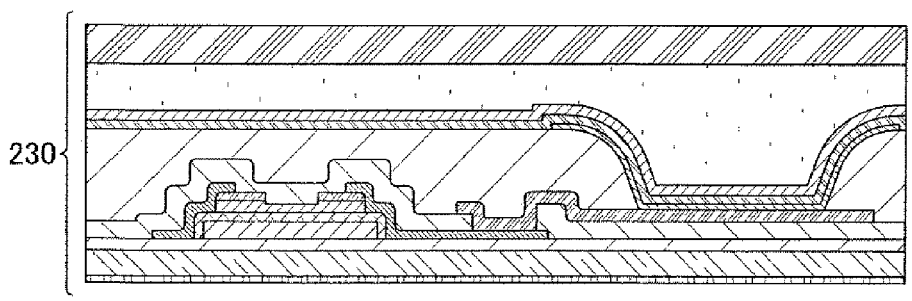

By the steps given above, the active matrix light-emitting device 230 that uses the organic thin film transistor can be manufactured (see FIG. 2D). For example, the adhesiveness of the light-emitting layer formed by an evaporation method is weak; however, when the separation method of the present invention in which separation is performed in the vicinity of a brittle layer formed over a silicone layer is used, even if a light-emitting layer formed by the evaporation method is selectively used, separation can be performed in the vicinity of the brittle layer (in this embodiment, at the interface between the silicone layer 101 and the brittle layer). The light-emitting device of this embodiment mode is thin and flexible. In addition, by provision of an organic compound layer between the brittle layer and the thin film transistor, the organic compound layer can be made to function as a support of the light-emitting device. For this reason, a support substrate used to support the light-emitting device need not be formed unnecessarily, and cost can be reduced.

Figure 3A:
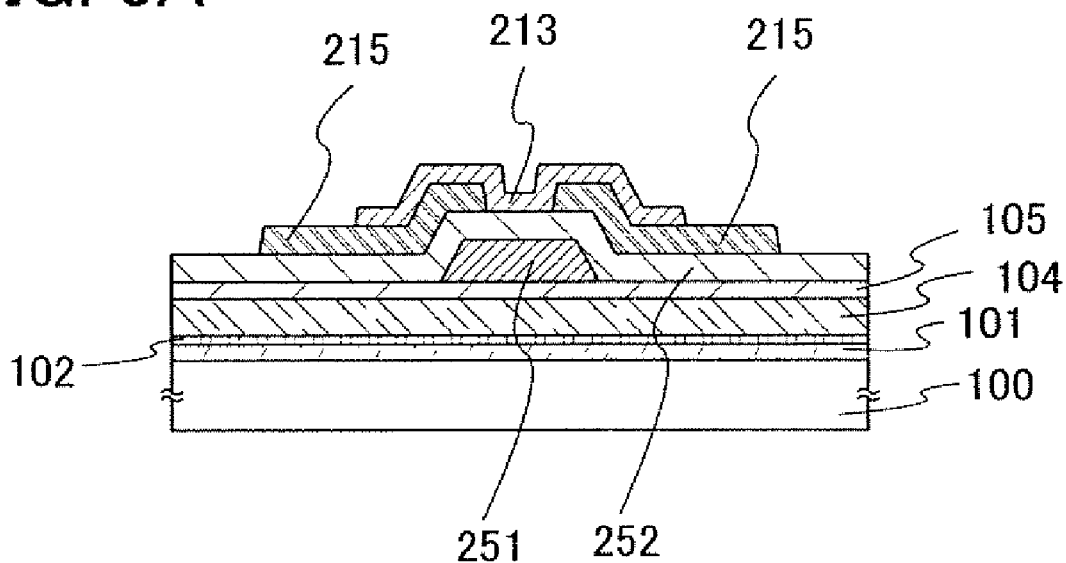
FIGS. 3A and 3B are diagrams illustrating an example of a cross-sectional structure of an organic thin film transistor.
Figure 3B:
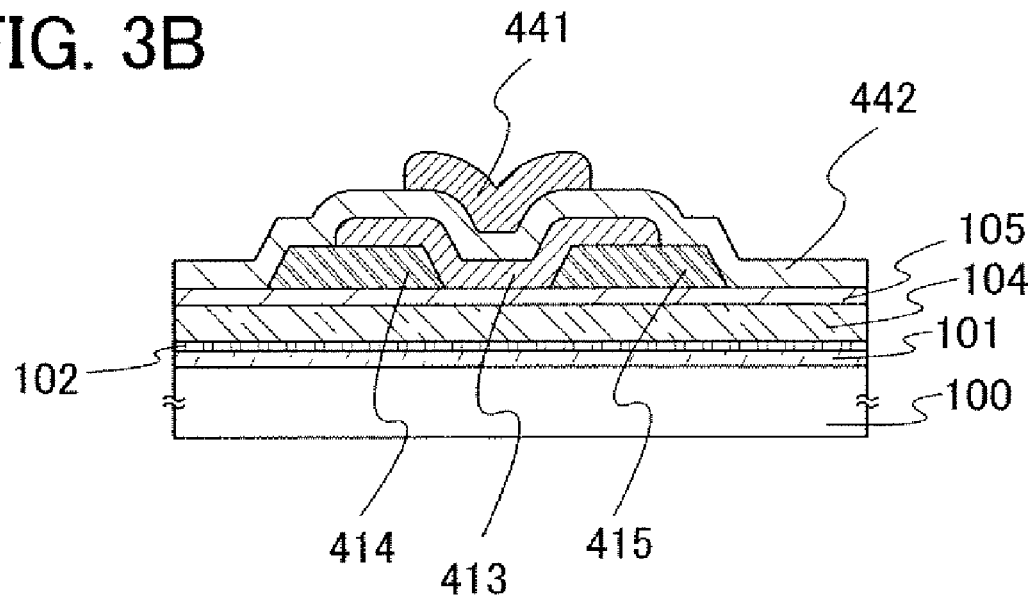

The structure of the organic thin film transistor 227 is not limited to that shown in FIG. 2C, and the structure shown in FIGS. 3A or 3B may be used.

FIG. 3A shows a structure called a bottom-contact structure. It is to be noted that portions that are the same as those in FIGS. 2A to 2D are denoted by the same reference numerals. When the bottom-contact structure is used, a process of photolithography or the like for microfabrication of a source wiring and a drain wiring can be used with little difficulty. Therefore, the structure of the organic thin film transistor may be selected in accordance with an advantage and a disadvantage of each structure.

A silicone layer 101, a brittle layer 102, an organic compound layer 104, and an inorganic insulating layer 105 are stacked over a substrate 100. A gate electrode 251 is formed over the inorganic insulating layer 105. There are no particular limitations on the materials used to form the gate electrode 251; for example, a metal such as gold, platinum, aluminum, tungsten, titanium, copper, molybdenum, tantalum, niobium, chromium, nickel, cobalt, or magnesium, an alloy that contains any of these metals, or a conductive polymer compound such as polyaniline, polypyrrole, polythiophene, polyacetylene, polydiacetylene, polysilicon that is doped with an impurity, or the like can be given. There are no particular limitations on the formation method of the gate electrode 251, and the gate electrode 251 may be manufactured by forming a layer by a sputtering method, an evaporation method, or the like and then processing the layer into a desired shape by etching or the like. In addition, the gate electrode 251 may be formed by using a droplet including a conductive substance by an ink-jet method or the like.

Subsequently, a gate insulating layer 252 is formed to cover the gate electrode 251. The gate insulating layer 252 is formed using an inorganic insulating material such as silicon oxide, silicon nitride, or silicon oxynitride. It is to be noted that the gate insulating layer 252 of any of these materials can be formed by a coating method such as a dipping method, a spin coating method, or a droplet discharge method; a CVD method; a sputtering method; or the like. Either nitridation and/or oxidation using high-density plasma may be performed on this gate insulating layer 252. By performing high-density plasma nitridation, a silicon nitride layer that contains nitrogen at a higher concentration can be obtained. The high-density plasma is generated by use of high-frequency microwaves, for example, with a frequency of 2.45 GHz. By using such high-density plasma, oxygen (or a gas including oxygen), nitrogen (or a gas including nitrogen), or the like is activated by plasma activation and is reacted with the insulating layer. High density plasma characterized by low electron temperature has active species of low kinetic energy; therefore, a layer with less plasma damage and defects than conventional plasma treatment can be formed. In addition, with use of high-density plasma, the roughness on the surface of the gate insulating layer 252 can be reduced, so that carrier mobility can be increased. Furthermore, the orientation of organic semiconductor material used to form a semiconductor layer formed over the gate insulating layer 252 becomes easy to align.

Next, a source electrode and a drain electrode 215 are formed over the gate insulating layer 252. Then, a semiconductor layer 213 is formed between the source electrode and drain electrode 215. For the semiconductor layer 213, the same material that is used to form the semiconductor layer 213 shown in FIG. 2B as described above can be used.

Furthermore, the structure shown in FIG. 3B will be described. FIG. 3B shows a structure called a top-gate structure.

A silicone layer 101, a brittle layer 102, an organic compound layer 104, and an inorganic insulating lays 105 are stacked over a substrate 100. A source electrode and a drain electrode 414 and 415 are formed over the inorganic insulating layer 105. Next, a semiconductor layer 413 is formed between the source electrode and drain electrode 414 and 415. Then, a gate insulating layer 442 is formed to cover the semiconductor layer 413 and the source electrode and drain electrode 414 and 415. Next, a gate electrode 441 is formed over the gate insulating layer 442. The gate electrode 441 overlaps the semiconductor layer 413 with the insulating layer 442 interposed therebetween.

In this manner, even with various kinds of structures of the organic thin film transistor, separation can be performed with use of this embodiment mode. For example, the adhesiveness of a semiconductor formed by a coating method is weak; however, when the separation method in this embodiment mode in which separation is performed in the vicinity of the brittle layer 102 is used, even if a semiconductor layer formed by the coating method is used, separation can be performed in the vicinity of the brittle layer 102 (in this embodiment, at the interface between the silicone layer 101 and the brittle layer 102).

In addition, a transistor that uses a semiconductor layer formed of ZnO or oxide of zinc gallium indium manufactured by a sputtering method or a PLD method can be used instead of an organic thin film transistor. In this case, the structure of FIGS. 3A or 3B can be applied. When ZnO or oxide of zinc gallium indium is used for the semiconductor layer, the gate insulating layer is preferably formed using oxide including aluminum or titanium. As thus described, the present invention is useful also in formation of a transistor that includes a process for irradiation of a substrate with plasma; after the transistor is formed over a substrate that can withstand plasma, a flexible substrate that has low endurance toward plasma is attached thereto and the transistor is separated from the substrate that can withstand plasma, whereby a light-emitting device can be manufactured.

It is to be noted that the brittle layer 102 at the surface of the light-emitting device may be removed. Furthermore, when the mechanical strength of the light-emitting device is low, a flexible substrate may be fixed to the surface at which separation is performed using an adhesive layer. In that case, in order to keep a space between substrates irrespective of changes in temperature, it is preferable that a flexible substrate with the same coefficient of thermal expansion as the flexible substrate 225 be used.

Furthermore, Embodiment Mode 1 and Embodiment Mode 2 can be freely combined with each other. For example, a liquid crystal display device can be manufactured using the organic thin film transistor given in Embodiment Mode 2 instead of the thin film transistor using a microcrystalline semiconductor layer given in Embodiment Mode 1. In addition, a light-emitting device can be manufactured using the thin film transistor using a microcrystalline semiconductor layer given in Embodiment Mode 1 instead of the organic thin film transistor given in Embodiment Mode 2, as well.

Furthermore, a light-emitting device shown in this embodiment mode can be used in a backlight of the liquid crystal display device shown in Embodiment Mode 1. The light-emitting device of this embodiment mode is thin and flexible, and thus, a thin liquid crystal display device can be manufactured.

Embodiment Mode 3

Here, description is made on an example in which a passive matrix light-emitting device is manufactured with reference to FIGS. 4A to 4C, FIG. 5, FIG. 6, FIGS. 7A and 7B, and FIG. 8.

A passive matrix (simple matrix) light-emitting device has a structure in which a plurality of anodes is provided in parallel stripe form (band form) and a plurality of cathodes is provided in parallel stripe form so that the anodes and the cathodes are perpendicular to each other and in which a light-emitting layer or a fluorescent layer is inserted at an intersection of the anode and the cathode. Thus, a pixel at an intersection of a selected anode (to which voltage is applied) and a selected cathode is turned on.

Figure 4A:
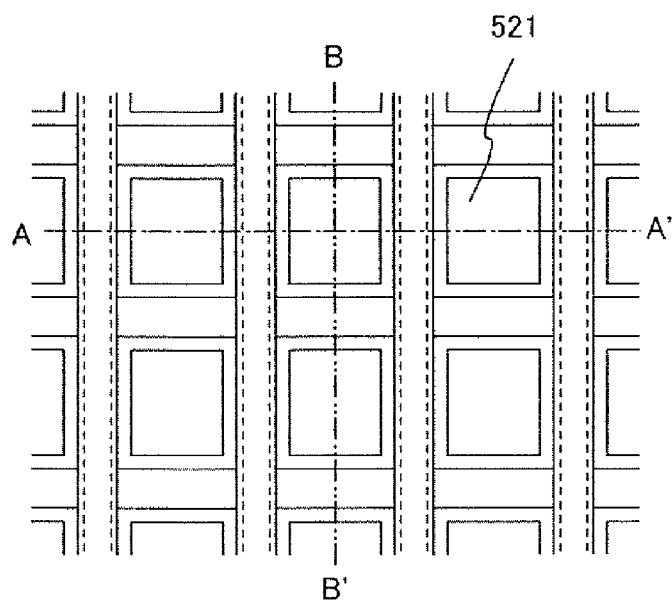
FIGS. 4A to 4C are a top view and cross-sectional views, each illustrating a method for manufacturing a semiconductor device of the present invention.
Figure 4C:
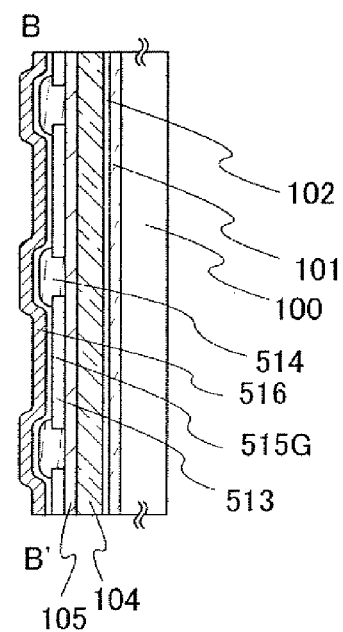
Figure 4B:
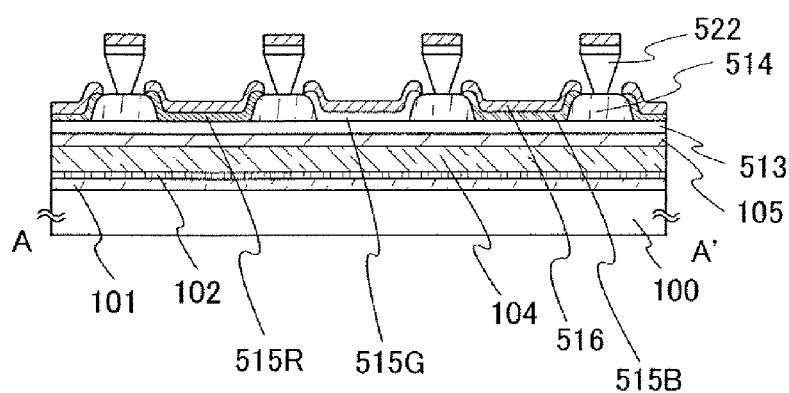

FIG. 4A is a top view of a pixel portion before a flexible substrate is attached to a second electrode 516 of a light-emitting element. FIG. 4B is a cross-sectional view taken along a chain line A-A' in FIG. 4A. FIG. 4C is a cross-sectional view taken along a chain line B-B'.

A silicone layer 101, a brittle layer 102, an organic compound layer 104, and an inorganic insulating layer 105 are stacked over a substrate 100 as in Embodiment Mode 2. Over the inorganic insulating layer 105, a plurality of first electrodes 513 is arranged in stripe form at regular intervals between adjacent first electrodes 513. Furthermore, over the first electrodes 513, a partition wall 514 that has openings is provided corresponding to their respective opening, and the partition wall 514 that has openings is formed of an insulating material (a photosensitive or non-photosensitive organic material (polyimide, acrylic, polyamide, polyimide-amide, or benzocyclobutene) or a silicone resin (for example, a silicon oxide layer that has an alkyl group). Note that each opening corresponding to a pixel serves as a light-emitting region 521.

A plurality of reversely-tapered partition walls 522 parallel to each other are provided over the partition 514 having openings to intersect with the first electrodes 513. The reversely-tapered partition walls 522 are formed by a photolithography method using a positive-type photosensitive resin, of which a portion unexposed to light remains as a pattern, and by adjusting the amount of light exposure or the length of development time so that a lower portion of a pattern is etched more.

Figure 5:
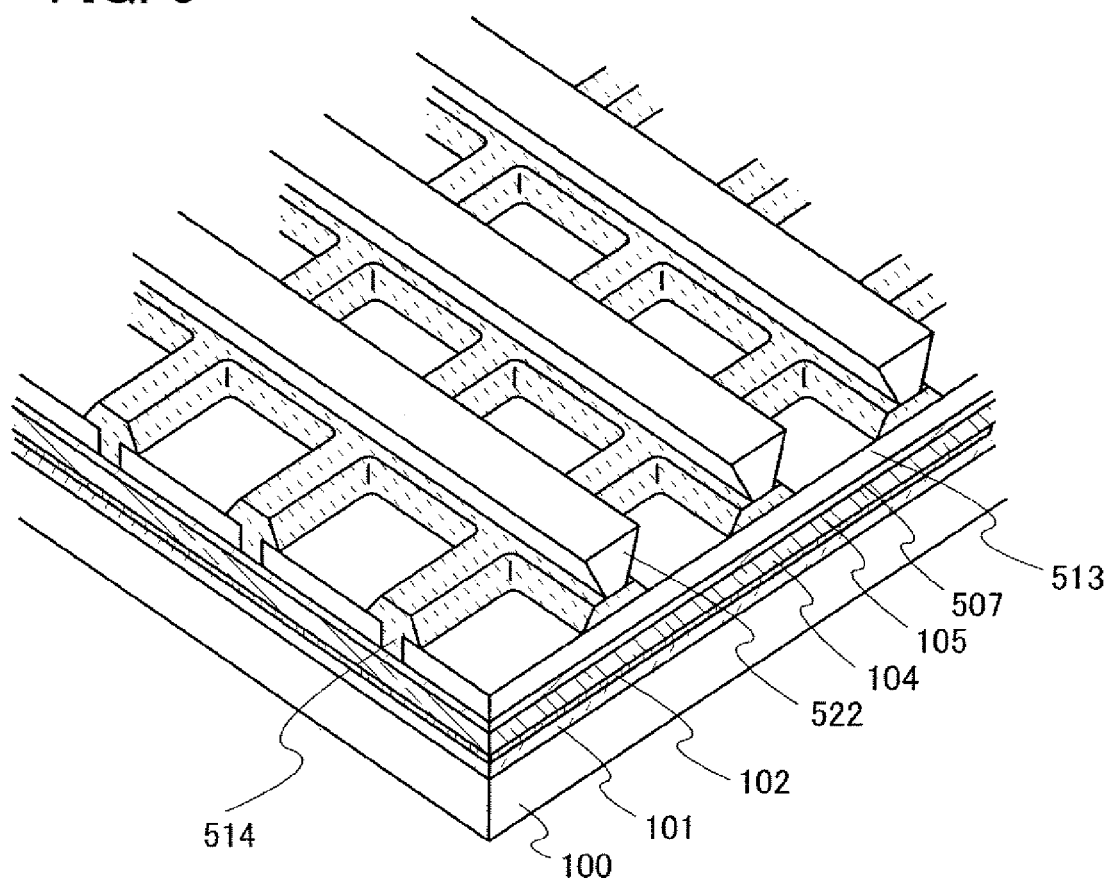
FIG. 5 is a perspective view illustrating a structure of a semiconductor device of the present invention.

FIG. 5 is a perspective view illustrating a device right after the plurality of parallel reversely-tapered partition walls 522 is formed.

The height of the reversely-tapered partition wall 522 is set to be greater than the combined film thicknesses of stacked layer that includes a light-emitting layer, and a conductive layer. When the stacked layer that includes the light-emitting layer and the conductive layer are formed and stacked over the substrate that has the structure shown in FIG. 5, they are separated into a plurality of electrically independent regions as shown in FIGS. 4A to 4C, and a stacked layer 515R, a stacked layer 515G, and a stacked layer 515B that each include a light-emitting layer, and the second electrodes 516 are formed. The second electrodes 516 are an electrode in stripe form which are parallel to each other and extend in a direction intersecting the first electrodes 513. It is to be noted that the stacked layer that includes a light-emitting layer, and the conductive layer are formed also over the reversely-tapered partition walls 522; however, the stacked layer that includes the light-emitting layer, and the conductive layer over the reversely-tapered partition walls 522 are isolated from the stacked layer 515R, the stacked layer 515G, and the stacked layer 515B that each include a light-emitting layer, and the second electrodes 516.

Here, an example of forming a light-emitting device is shown. The light-emitting device shown here is capable of full-color display where emission of three different colors of light (R, G, and B) is obtained by selective formation of the stacked layer 515R, the stacked layer 515G, and the stacked layer 515B that each includes a light-emitting layer. The stacked layer 515R, the stacked layer 515G, and the stacked layer 515B that each includes a light-emitting layer are formed into a mutually-parallel stripe pattern.

Furthermore, stacked layer including a light-emitting layer which emits light of the same emission color into the entire surface may be formed to provide light-emitting elements of a single color, and the light-emitting device may be capable of monochrome display or area color display. In addition, a light-emitting display device capable of full-color display may be obtained by a combination of a color filter and a light-emitting device capable of white light emission.

Figure 6:
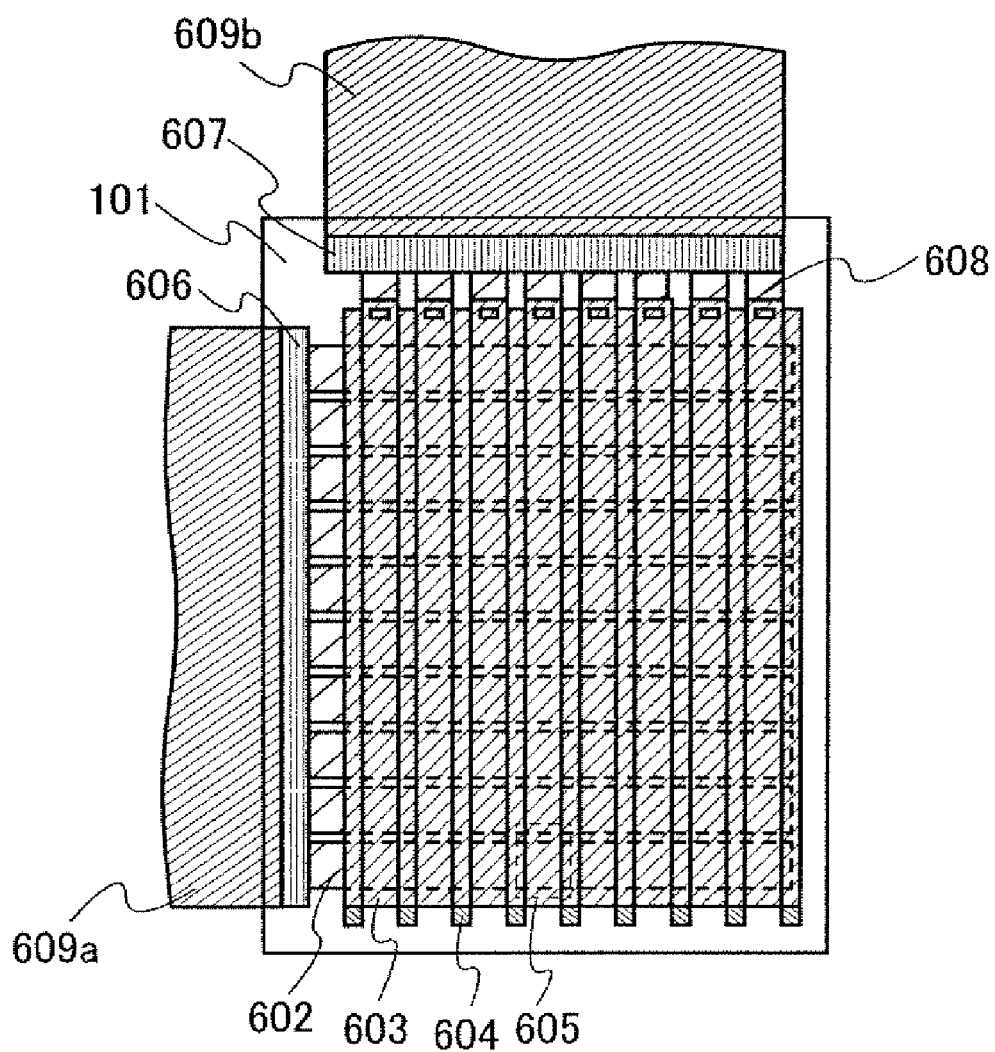
FIG. 6 is a top view illustrating a structure of a semiconductor device of the present invention.

Next, a top view of a light-emitting module in which an FPC and the like are provided is shown in FIG. 6.

It is to be noted that a "light-emitting device" in the present specification refers to an image display device, a light-emitting device, or a light source (which includes a lighting device). Further, the light-emitting device in the present specification includes all of the following modules: a module in which a connector such as a flexible printed circuit (FPC), a tape automated bonding (TAB) tape, or a tape carrier package (TCP) is attached to a light-emitting device; a module in which a printed wiring board is provided at the end of a TAB tape or a TCP; and a module in which an integrated circuit (IC) is directly mounted on a light-emitting element by a chip on glass (COG) method.

In a pixel portion forming an image display as shown in FIG. 6, scanning lines and data lines are arranged to intersect so that the scanning lines and data lines are mutually orthogonal.

The first electrode 513, the second electrode 516, and the reversely-tapered partition wall 522 of FIGS. 4A to 4C correspond to a scanning line 602, a data line 603, and a partition wall 604 of FIG. 6, respectively. A light-emitting layer is interposed between the data line 603 and the scanning line 602, and an intersection indicated by a region 605 is defined as a single pixel.

It is to be noted that the data line 603 is electrically connected to a connection wiring 608 at an end of the wiring, and the connection wiring 608 is connected to an FPC 609b via an input terminal 607. In addition, the scanning line 602 is connected to an FPC 609a via an input terminal 606.

Next, a flexible substrate is fixed using an adhesive layer. Then, the light-emitting element is separated from the substrate 100. Then, a brittle layer 102 is removed. The brittle layer 102 is not necessarily removed and may be left.

In addition, if needed, an optical film such as a polarizing plate, a circularly polarizing plate (including an elliptically polarizer), a retardation plate (a quarter-wave plate, a half-wave plate), or a color filter may be provided on an emission surface of the light-emitting element, as appropriate. Moreover, the polarizing plate or circularly polarizing plate may be provided with an antireflective layer. For example, antiglare treatment can be performed by which reflected light is diffused on unevenness of a surface so as to reduce reflected glare.

Through the above steps, a flexible passive matrix light-emitting device can be manufactured. Because thermocompression bonding is performed to mount an FPC, it is preferable that the FPC be mounted on a hard substrate by thermocompression bonding. In accordance with the present invention, separation is performed after mounting the FPC; therefore, a flexible and thin light-emitting device can be manufactured.

The example in which a driver circuit is not provided over the substrate has been described with reference to FIG. 6. An example of a method for manufacturing a light-emitting module in which an IC chip having a driver circuit is provided will be described hereinafter with reference to FIGS. 7A and 7B.

First, over a substrate 100, as in Embodiment Mode 1, a silicone layer, a brittle layer, and an organic compound layer are stacked. Over this organic compound layer, a scanning line 602 (which also functions as an anode) having a stacked structure where the lower layer is a reflective metal layer and the upper layer is a transparent conductive oxide layer is formed. Simultaneously, connection wiring 608, connection wiring 709a, and connection wiring 709b and input terminals are formed.

Next, a partition wall that has openings corresponding to their respective pixel, is provided. Then, over the partition wall (not shown) that has openings, a plurality of reversely-tapered partition walls 604 that are parallel to each other is formed to intersect the scanning lines 602. A top view of what is obtained after the steps described above have been completed is shown in FIG. 7A.

Figure 7A:
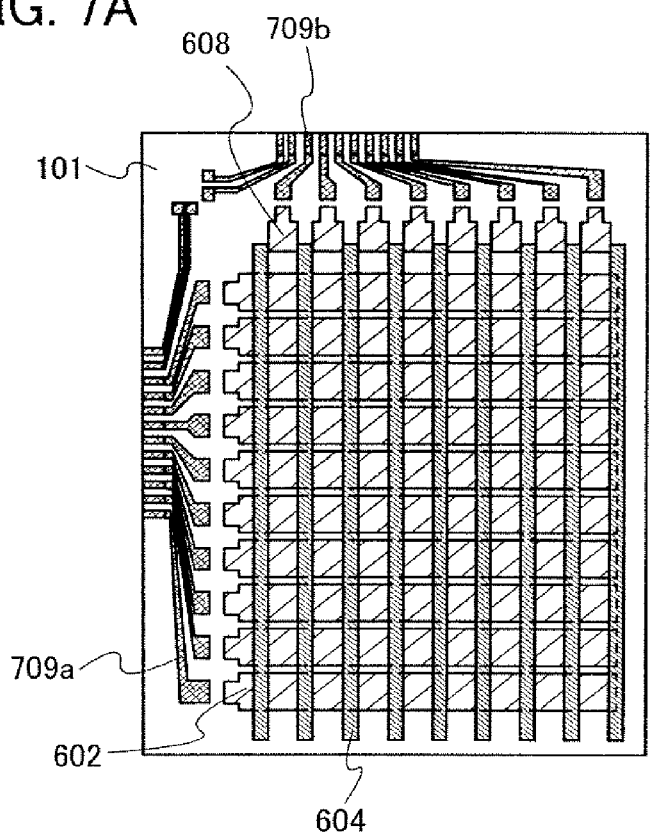
FIGS. 7A and 7B are top views illustrating a structure of a semiconductor device of the present invention.
Figure 7B:
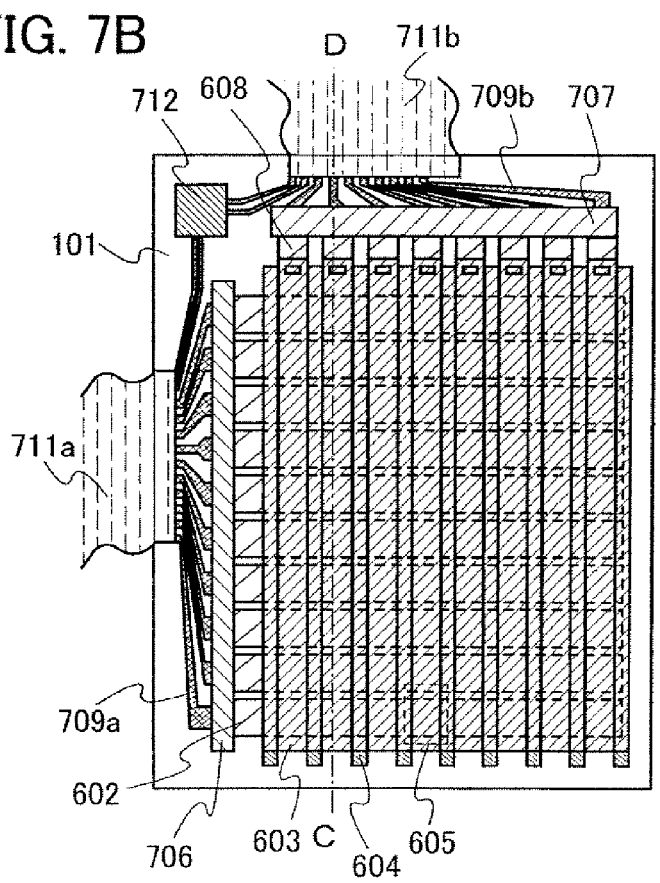

Subsequently, a stacked layer that includes a light-emitting layer and a transparent conductive layer are formed and stacked, so that they are separated into a plurality of electrically independent regions as shown in FIG. 7B. Thus, the stacked layer including a light-emitting layer and data lines 603 including the transparent conductive layer are formed. The data lines 603 formed using the transparent conductive layer are electrodes of mutually-parallel stripe form that extend intersecting the scanning lines 602.

Next, in a region at the periphery (outer side) of a pixel portion, an IC 706 on the scanning line side and an IC 707 on the data line side, each of which has a driver circuit that is used to transmit a variety of signals to the pixel portion, are mounted by a COG method. TCP or a wire bonding method may be used as a mounting technique, instead of the COG method. In a TCP, an IC is mounted on a TAB tape and the TAB tape is connected to a wiring over an element formation substrate, so that the IC is mounted. The IC 706 on the scanning line side and the IC 707 on the data line side may be formed using a silicon substrate, or may have driver circuits formed using a thin film transistor over a glass substrate, a quartz substrate, or a plastic substrate. In addition, an example is shown in which one IC is provided on one side; however, a plurality of ICs divided into a plurality of parts may be provided on one side.

It is to be noted that the data line 603 is electrically connected to the connection wiring 608 at the end of the wiring, and the connection wiring 608 is connected to the IC 707 on the data line side. This is because it is difficult to from the IC 707 on the data line side over the reversely-tapered partition walls 604.

The IC 706 on the scanning line side, which is provided to have the structure described above, is connected to an FPC 711*a* via the connection wiring 709*a*. In addition, the IC 707 on the data line side is connected to an FPC 711*b* via the connection wiring 709*b*.

Moreover, integration is achieved by mounting an IC chip 712 (a memory chip, a CPU chip, a power supply circuit chip, or the like).

Next, a flexible substrate is fixed using an adhesive layer so as to cover the IC chip 712.

Figure 8:
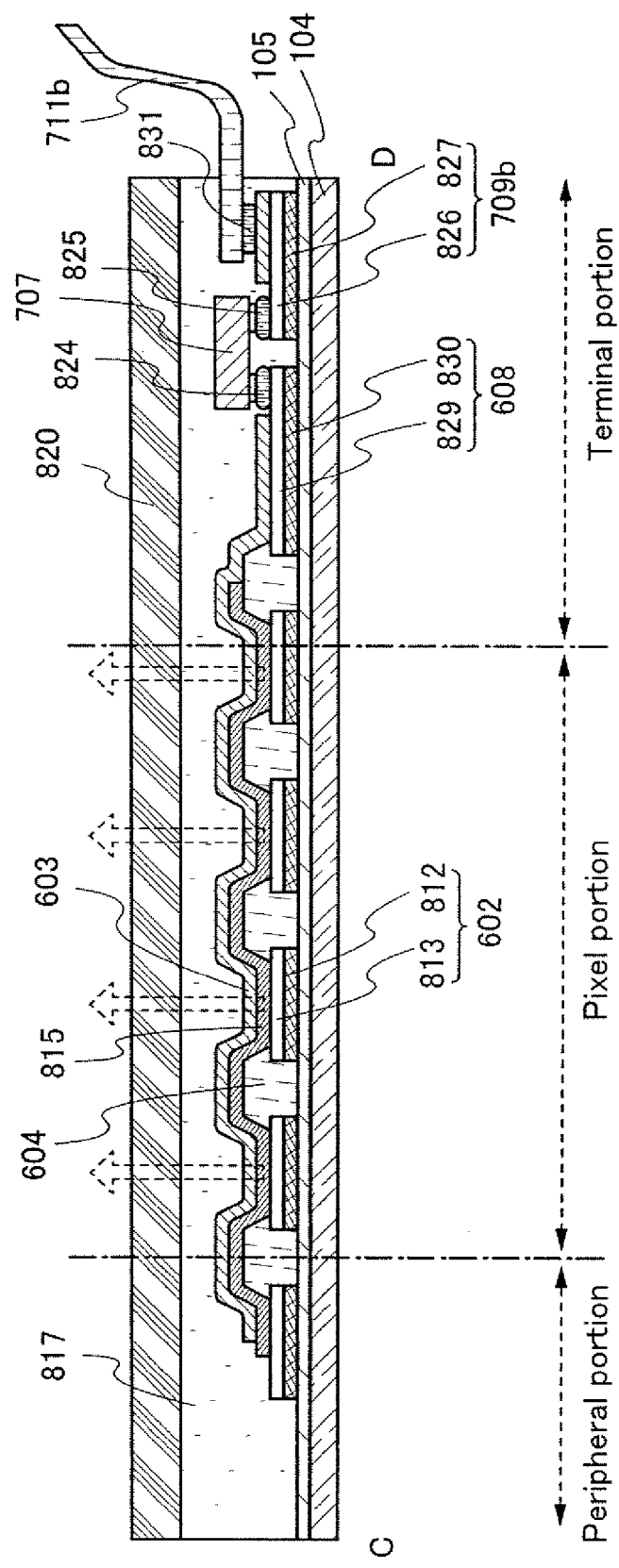
FIG. 8 is a cross-sectional view illustrating a structure of a semiconductor device of the present invention.

Next, the light-emitting element is separated from the substrate 100. FIG. 8 shows an example of a cross-sectional structure taken along a chain line C-D of FIG. 7B.

The scanning line 602 has a stacked structure of two layers, and a lower layer 812 is a reflective metal layer and an upper layer 813 is a transparent conductive oxide layer. The upper layer 813 is preferably formed using a conductive layer that has a high work function; as well as a layer that contains indium tin oxide (ITO), for example, a layer that contains a transparent conductive material such as indium tin oxide containing a silicon element or indium zinc oxide (IZO) in which zinc oxide is mixed into indium oxide, or a compound of a combination of any of these materials can be used. Further, the lower layer 812 is formed using a silver layer, an aluminum layer, or an aluminum-alloy layer.

The partition wall 604 for insulating adjacent data lines from each other is formed of resin, and regions surrounded by the partition wall have the same area as that of light-emitting regions.

The data line 603 (cathode) is formed so as to intersect a scanning line (anode). The scanning line 602 (cathode) is formed using a transparent conductive layer such as a layer of indium tin oxide (ITO), indium tin oxide containing a silicon element, or indium zinc oxide (IZO). Because this embodiment mode shows an example of a top-emission light-emitting device in which emitted light passes through a first flexible substrate 820, it is important that a scanning line 816 be transparent.

Furthermore, the flexible substrate 820 is attached to the pixel portion, in which a light-emitting element is arranged at a point of intersection between the scanning line and the data line that sandwich a stacked layer 815 having a light-emitting layer; a terminal portion; and a peripheral portion, using an adhesive layer 817. The adhesive layer 817 may be formed using an ultraviolet-curing resin, a thermosetting resin, a silicone resin, an epoxy resin, an acrylic rein, a polyimide resin, a phenol resin, PVC (polyvinyl chloride), PVB (polyvinyl butyral), or EVA (ethylene vinyl acetate).

The connection wiring 709*b* is formed in the terminal portion, and the FPC 711*b* (a flexible printed circuit) that is connected to an external circuit is attached to this portion. The connection wiring 709*b* is formed of a stacked layer of a reflective metal layer 826 and a transparent conductive oxide layer 827 that extends from the second electrode; however, there are no particular limitations on the structure of the connection wiring 709*b*.

For the method by which the FPC 711*b* is mounted to the terminal portion, a connection method that uses an anisotropic conductive material or a metal bump, or a wire bonding method can be employed. In FIG. 8, the connection is performed using an anisotropic conductive adhesive 831.

In addition, the IC on the data line side that has a driver circuit for transmitting a variety of signals to the pixel portion is electrically connected to the periphery of the pixel portion using anisotropic conductive materials 824 and 825. In order to form a pixel portion capable of color display, 3072 data lines and 768 scanning lines are required for the XGA display class. Such number of the data lines and scanning lines are segmented for every several blocks at an end of the pixel portion, and then gathered in accordance with the pitch of output terminals of ICs.

By the above steps, a light-emitting module that is sealed by the organic compound layer 104 and the flexible substrate 820, and in which an IC chip is mounted can be manufactured. Because thermocompression bonding is performed to mount an IC chip, it is preferable that the IC chip be mounted on a hard substrate by thermocompression bonding. By the present invention, separation is performed after an IC chip is mounted on the light-emitting device, and the light-emitting device can be manufactured.

Embodiment Mode 4

This embodiment mode describes an example of manufacturing a semiconductor device which functions as a wireless chip. The semiconductor device in the present embodiment mode is capable of reading and writing data without contact. Data transmission methods are broadly classified into three: an electromagnetic coupling method in which a pair of coils are placed facing each other and communication is performed by mutual induction; an electromagnetic induction method in which communication is performed by induction field; and an electric wave method in which communication is performed using electric waves, and any of these methods may be used.

Furthermore, there are two ways for providing an antenna used in the transmission of data. One way is to provide a terminal portion in a semiconductor component in which a plurality of semiconductor elements are provided (hereinafter, referred to as an element substrate) and connect an antenna that is formed over a different substrate, to the terminal portion. The other way is to build an antenna over an element substrate over which a plurality of semiconductor elements, passive elements, and the like are provided.

First, a method for manufacturing a semiconductor device in the case where an antenna is provided by connecting the antenna formed over a different substrate to a terminal portion of an element substrate, will be described hereinafter.

First, as in Embodiment Mode 1, a silicone layer 101 is formed over a substrate 100, the surface of the silicone layer 101 is subjected to plasma treatment to form a brittle layer 102, and an organic compound layer 104 is formed over the brittle layer 102. It is to be noted that, as shown in Embodiment Mode 1, an inorganic insulating layer 105 may be formed over the organic compound layer 104, if necessary.

Figure 9A:
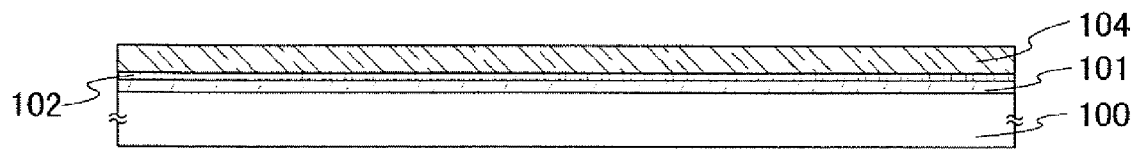
FIGS. 9A to 9D are cross-sectional views and a perspective view illustrating a method for manufacturing a semiconductor device of the present invention.
Figure 9B:
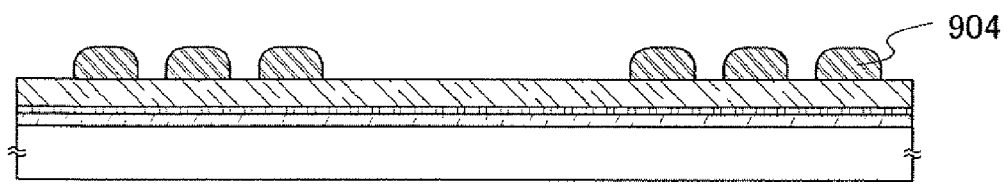

Next, as shown in FIG. 9B, a conductive layer 904 functioning as an antenna is formed over the organic compound layer 104. The conductive layer 904 functioning as an antenna is formed by discharging a droplet or a paste including a conductive material such as gold, silver, or copper by a droplet discharge method (such as an inkjet method or a dispenser method) and then baking and drying. Forming the antenna by the droplet discharge method enables the number of steps and cost corresponding to the steps to be decreased. Further, the conductive layer 904 may also be formed by use of a screen printing method. In the case of employing a screen printing method, the conductive layer 904 functioning as an antenna is formed by selectively printing a conductive paste in which conductive particles each having a grain size of several nanometers to several tens of micrometers are dissolved or dispersed in an organic resin. As the conductive particle, a fine particle or a dispersive nanoparticle of one or more metals of silver (Ag), gold (Au), copper (Cu), nickel (Ni), platinum (Pt), palladium (Pd), tantalum (Ta), molybdenum (Mo), titanium (Ti), and the like, or silver halide can be used. In addition, as the organic resin included in the conductive paste, one or a plurality of organic resins each functioning as a binder, a solvent, a dispersant, or a coating of the metal particle can be used. Typically, organic resins such as an epoxy resin and a silicone resin can be given as examples. When the conductive layer is formed, baking is preferably performed after the conductive paste is pushed out. Alternatively, fine particles containing solder or lead-free solder as its main component may be used. In that case, fine particles having a grain size of less than or equal to 20 μm are preferably used. Solder or lead-free solder has an advantage such as low cost. Further, as well as the above-described materials, ceramic, ferrite, or the like may be used for an antenna.

In the case of manufacturing an antenna by a screen printing method or a droplet discharge method, the conductive layer is formed in a desired shape and then baked. The baking temperature is from 200° C. to 300° C. Although the baking is possible at a temperature lower than 200° C., the conductivity of the antenna cannot be secured and the communication distance of the antenna may also be shortened in that case. In consideration of these points, it is preferable that, after the antenna is formed over a separate substrate, namely, a substrate that can withstand high temperatures, the antenna be separated from the substrate and connected to the element substrate.

Moreover, the antenna may be formed using gravure printing or the like in addition to being formed by a screen printing method, as well, or the antenna can be formed of a conductive material using a plating method or the like. Since an antenna formed by a plating method may have poor adhesiveness depending on a plating material or plating conditions, it is effective to use the separation method in which the silicone layer 101 is used, as shown in Embodiment Mode 1 to 3.

Figure 9C:
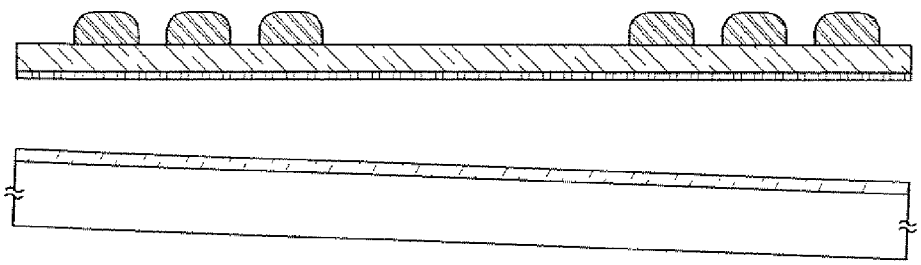

Next, separation is performed, as shown in FIG. 9C, to separate the organic compound layer 104 from the substrate 100. Because separation can be performed with the addition of relatively small force in a separation method of the present invention that uses a brittle layer, yield can be improved. In addition, because relatively small force is applied in the separation method of the present invention in which the separation is performed in the vicinity of the brittle layer, deformation of the organic compound layer 104 can be suppressed when the separation is performed. Note that the brittle layer 102 may be removed.

Figure 9D:
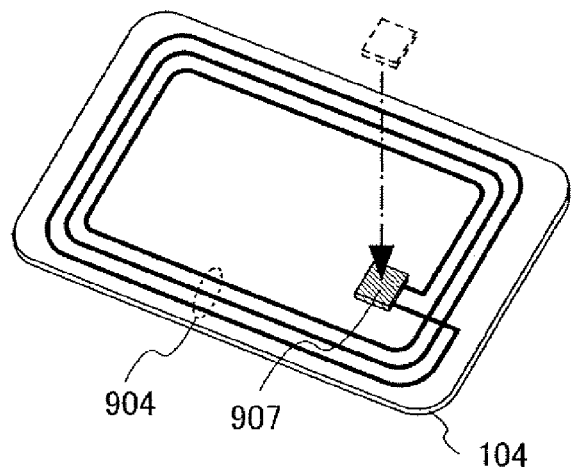

Next, as shown in FIG. 9D, an element substrate 907 is placed over the surface of the organic compound layer 104 over which the compound layer 904 is provided. Electrical connection between a terminal portion of the element substrate and the conductive layer 904 is made by pressure bonding with the use of an anisotropic conductive material.

It is to be noted that, in FIGS. 9A to 9D, after a stacked body that includes the conductive layer 904 is separated from the substrate 100, the conductive layer 904 and the element substrate 907 are connected to each other; alternatively, the stacked body that includes the conductive layer 904 may be separated from the substrate 100 after the conductive layer 904 is baked and connected to the element substrate 907.

Moreover, when a plurality of conductive layers that each function as an antenna are formed in the stacked body that includes the conductive layer 904, after the stacked body is divided up and a plurality of stacked bodies that each have the conductive layer 904 that functions as an antenna are formed, the element substrate may be connected to the conductive layer 904.

Furthermore, in FIG. 9D, an example is shown in which the element substrate 907 has a smaller size than that of the organic compound layer 104; however, the present invention is not particularly limited to this case, and an element substrate having almost the same size as the organic compound layer 104 may be provided or an element substrate having a larger size than the organic compound layer 104 may be provided.

Through the above steps, a semiconductor device functioning as a wireless chip is completed. The semiconductor device is thin and flexible. Moreover, by provision of an organic compound layer between a brittle layer and a thin film transistor, the organic compound layer can be made to function as a support of the semiconductor device. For this reason, a support substrate used to support the semiconductor device need not be formed unnecessarily, and cost can be reduced.

It is to be noted that, lastly, to protect the element substrate 907, another flexible substrate may be attached to the organic compound layer 104 so as to cover the element substrate 907.

Next, a method for manufacturing a semiconductor device that functions as a wireless chip by forming an antenna over an element substrate over which one or a plurality of semiconductor elements is provided will be described with reference to FIGS. 10A to 10D.

Figure 10A:
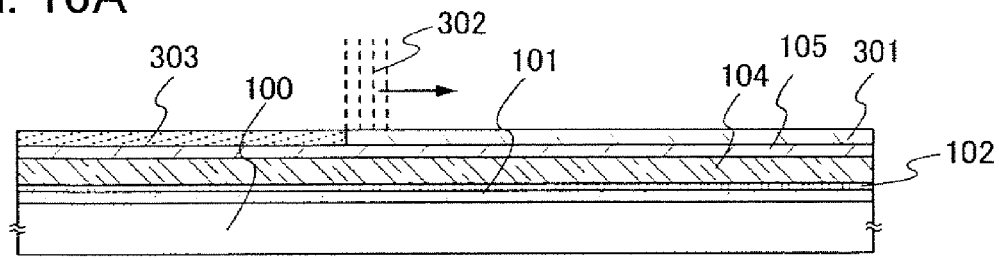
FIGS. 10A to 10D are cross-sectional views illustrating a method for manufacturing a semiconductor device of the present invention.

As in Embodiment Mode 1, as shown in FIG. 10A, a silicone layer 101 is formed over a substrate 100, the surface of the silicone layer 101 is subjected to plasma treatment to form a brittle layer 102, an organic compound layer 104 is formed over the brittle layer 102, and an inorganic insulating layer 105 is formed over the organic compound layer 104.

Next, an amorphous semiconductor layer 301 is formed over the inorganic insulating layer 105. The amorphous semiconductor layer is formed by a plasma CVD method using silicon hydride such as $SiH_4$, or $Si_2H_6$, or germane. Here, an amorphous silicon layer is formed at a thickness of from 10 nm to 100 nm, preferably, from 20 nm to 80 nm, by a plasma CVD method.

Next, the amorphous semiconductor layer 301 is scanned with a laser beam 302, and a crystalline semiconductor layer is formed. In FIG. 10A, an example is shown in which a crystalline semiconductor layer 303 is formed by a laser annealing method with which the amorphous semiconductor layer 301 is scanned with the laser beam.

When crystallization is performed using a laser annealing method, a pulsed laser can be used. A laser wavelength is set to be in a visible region to ultraviolet region (less than or equal to 800 nm), preferably an ultraviolet region (less than or equal to 400 nm) so that the semiconductor film can efficiently absorb the laser beam. As a laser oscillator, an excimer laser oscillator of KrF, ArF, XeCl, XeF, or the like; a gas laser oscillator of $N_2$, He, He—Cd, Ar, He—Ne, HF, or the like; a solid-state laser oscillator using a crystal such as YAG, $GdVO_4$, $YVO_4$, YLF, $YAlO_3$, $SCO_3$, $LU_2O_3$, or $Y_2O_3$, that is doped with Cr, Nd, Er, Ho, Ce, Co, Ti, Yb, or Tm; a metal vapor laser oscillator of a helium-cadmium laser or the like; or the like can be used. Note that in the solid-state laser oscillator, the third harmonic to the fifth harmonic of the fundamental wave is preferably used. A laser beam is focused by an optical system and used; for example, the laser beam is processed into a linear form, and laser annealing is performed. Laser annealing conditions are selected as appropriate by an operator. For one example of the laser annealing conditions, the laser pulse repetition rate is set to 30 Hz, and the laser energy density is set to from 100 mJ/cm$^2$ to 500 mJ/cm$^2$ (typically, from 300 mJ/cm$^2$ to 400 mJ/cm$^2$); then, the entire surface of the substrate is irradiated with the linear beam, and laser irradiation is performed with the superposition percentage (overlap percentage) of the linear beams set to be from 80% to 98% at this time. In this way, a crystalline semiconductor layer can be formed.

Here, a crystalline silicon layer is formed by irradiation of an amorphous silicon film with an excimer laser beam.

It is to be noted that, in order to prevent ejection of hydrogen from the amorphous silicon layer, before the amorphous silicon layer is irradiated with a laser beam, it is preferable that the amorphous silicon layer be irradiated with a laser beam of lower energy than the laser beam used for crystallization to remove hydrogen that is in the amorphous silicon layer.

Next, the crystalline semiconductor layer 303 is selectively etched, and semiconductor layers 321 and 322 are formed. Here, as an etching method of the crystalline semiconductor layer, dry etching, wet etching, or the like can be used. In this case, after a resist is applied over the crystalline semiconductor layer 303, exposure and development are conducted to form a resist mask. With the use of the resist mask, the crystalline semiconductor layer 303 is selectively etched by a dry etching method with a flow ratio of $SF_6:O_2=4:15$. And then, the resist mask is removed.

Next, a gate insulating layer 323 is formed over the semiconductor layers 321 and 322. The gate insulating layer 323 is formed as a single layer or a stacked structure of silicon nitride, silicon nitride that includes oxygen, silicon oxide, silicon oxide that inclulded nitrogen, or the like. Here, silicon oxide including nitrogen with a thickness of 115 nm is formed by a plasma CVD method.

Next, gate electrodes 324 and 325 are formed. The gate electrodes 324 and 325 can be formed of a metal or of a polycrystalline semiconductor in which an impurity of one conductivity type is added. When the gate electrodes 324 and 325 are formed using metal, tungsten (W), molybdenum (Mo), titanium (Ti), tantalum (Ta), aluminum (Al), or the like can be used. Further, a metal nitride in which one of the above metals has been nitrided can be used, as well. Further, the gate electrodes 324 and 325 may have a stacked structure of a first layer made of the metal nitride and a second layer made of the metal. Further, a paste including fine particles can be discharged over the gate insulating layer by a droplet discharge method, and be dried and baked to form the gate electrodes 324 and 325. Moreover, a paste containing fine particles can be printed over the gate insulating layer by a printing method and be dried and baked to form the gate electrodes. Typical examples of the fine particles may be fine particles containing, as its main component, any of gold, silver, copper, an alloy of gold and silver, an alloy of gold and copper, an alloy of silver and copper, and an alloy of gold, silver, and copper. Here, after a tantalum nitride layer with a film thickness of 30 nm and a tungsten layer with a thickness of 170 nm are formed over the gate insulating layer 323 by a sputtering method, the tantalum nitride layer and the tungsten layer are etched selectively using a resist mask that is formed by a photolithography process, and the gate electrodes 324 and 325 in which the end of the tantalum nitride layer projects beyond the end of the tungsten layer are formed.

Next, the gate electrodes 324 and 325 are used as masks, an impurity element imparting n-type conductivity or an impurity element imparting p-type conductivity is added to the semiconductor layers 321 and 322, and source regions and drain regions 326 to 329 are formed. Here, phosphorus, which is an impurity element imparting n-type conductivity, is added to form the source regions and the drain regions 326 to 329.

After doping is performed, the impurity element added to the semiconductor layers may be activated. Here, the impurity may be activated by irradiation with a laser beam. By the above steps, thin film transistors 320a and 320b are formed. It is to be noted that n-channel thin film transistors are formed for the thin film transistors 320a and 320b. Furthermore, although not shown in the diagrams, a driver circuit is formed using a p-channel thin film transistor and an n-channel thin film transistor.

Next, an interlayer insulating layer used to insulate the gate electrodes of the thin film transistors 320a and 320b and wirings is formed. Here, the interlayer insulating layer is formed by stacking a silicon oxide layer 333, a silicon nitride layer 334, and a silicon oxide layer 335. In addition, over the silicon oxide layer 335, which is a part of the interlayer insulating layer, wirings 336 to 339 used to connect to the source regions and drain regions of the thin film transistors 320a and 320b are formed. Here, after a Ti layer with a thickness of 100 nm, an Al layer with a thickness of 333 nm, and a Ti layer with a thickness of 100 nm are formed successively by a sputtering method, the layers are etched selectively using a resist mask that is formed by a photolithography process, and the wirings 336 to 339 are formed. After that, the resist mask is removed.

Subsequently, a conductive layer 313 functioning as an antenna is formed over the wiring 339 connected to the thin film transistor 332. The conductive layer 313 functioning as an antenna can be formed in the same way as the conductive layer 904 functioning as an antenna shown in FIGS. 9A to 9D is formed. Alternatively, by forming a conductive layer by a sputtering method and then etching the conductive layer selectively using a mask that is formed by a photolithography process, so that the conductive layer 313 functioning as an antenna can be formed.

Figure 10B:
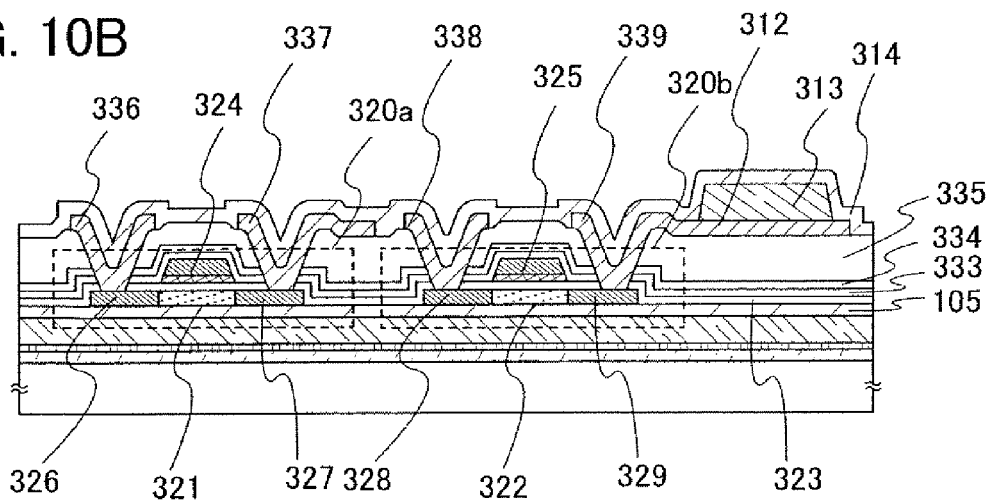

Then, a passivation layer 314 may be formed over the conductive layer 313 functioning as an antenna and the interlayer insulating layer. By formation of the passivation layer 314, contamination of the conductive layer 313 functioning as an antenna and the thin film transistors 320a and 320b with moisture, oxygen, or impurities from the outside can be avoided. The passivation layer 314 is formed of silicon nitride, silicon oxide, silicon nitride oxide, silicon oxynitride, diamond-like carbon (DLC), nitrogen carbide, or the like. FIG. 10B shows a cross-sectional view at a stage where the steps up to here are completed.

Figure 10C:
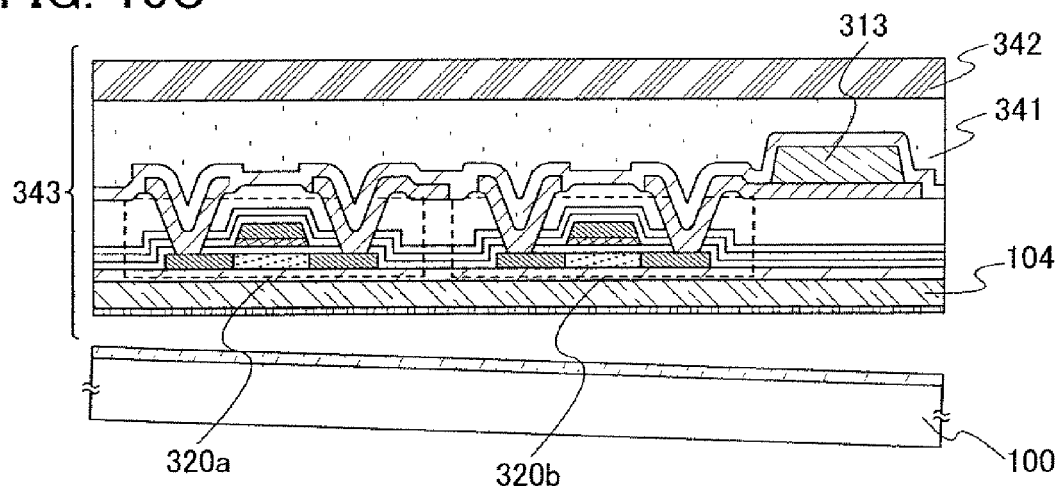
Figure 10D:
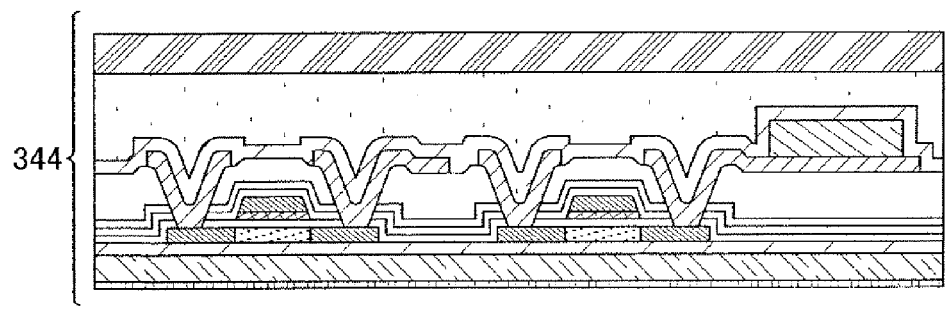
Figure 11A:
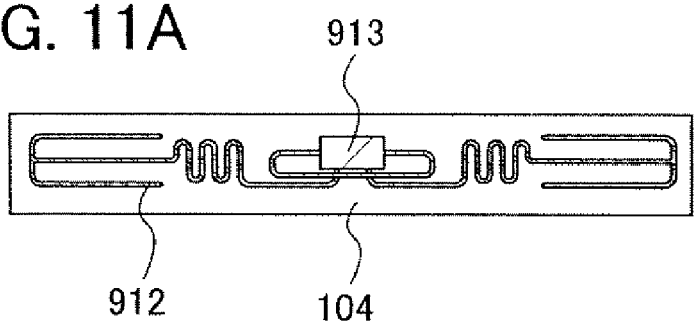
FIGS. 11A to 11D are top views illustrating shapes of an antenna which are applicable to the present invention.
Figure 11B:
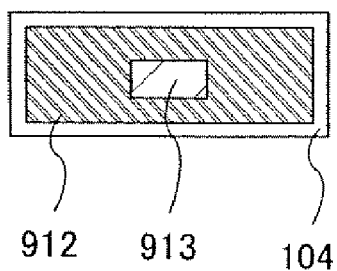
Figure 11C:
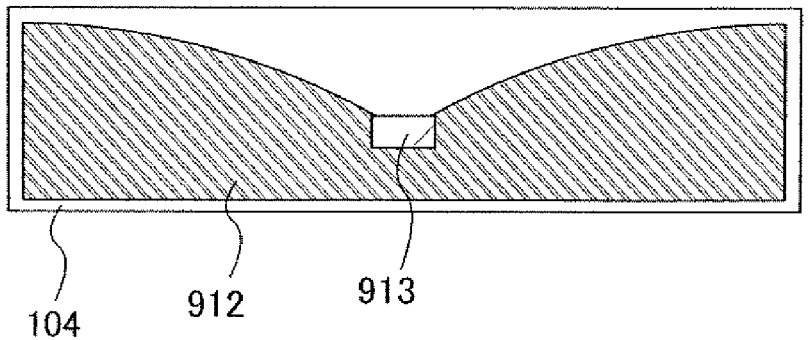
Figure 11D:
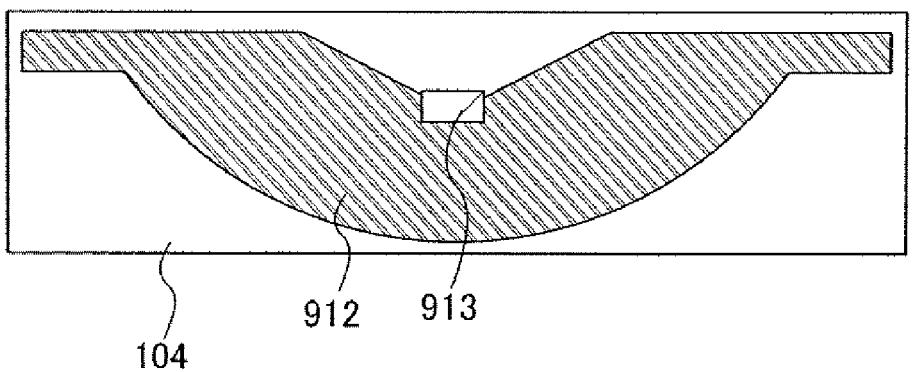

Next, as shown in FIG. 10C, a flexible substrate 342 is fixed over the passivation layer 314 using an adhesive layer 341.

Next, a stacked body 343 that includes the organic compound layer 104, the thin film transistors 320a and 320b, the conductive layer 313 functioning as an antenna, the adhesive layer 341, and the flexible substrate 342 is separated from the substrate 100. Here, separation is performed in the brittle layer 102. Since the brittle layer 102 is weak, separation can be performed with relatively small force. It is to be noted that the brittle layer 102 may be removed.

It is to be noted that, when a plurality of semiconductor devices is included in the stacked body 343 that includes the organic compound layer 104, the thin film transistors 320a and 320b, the conductive layer 313 functioning as an antenna and the flexible substrate 342, the stacked body 343 may be divided up and the plurality of semiconductor devices may be cut apart. By such steps, a plurality of semiconductor devices can be manufactured by a single separation step.

By the steps given above, a semiconductor device 344 that functions as a wireless chip can be completed. The semiconductor device of the present embodiment mode is thin and flexible. Moreover, by provision of an organic compound layer between a brittle layer and a thin film transistor, the organic compound layer can be made to function as a support of the semiconductor device. For this reason, a support substrate used to support the semiconductor device need not be formed unnecessarily, and cost can be reduced Here, an electromagnetic coupling method or an electromagnetic induction method (for example, a 13.56 MHz band) is employed as the signal transmission method in the semiconductor device. In the electromagnetic coupling method or the electromagnetic induction method, electromagnetic induction caused by change in magnetic field density is utilized; therefore, an upper surface of the conductive layer functioning as an antenna is preferably formed into an annular shape (e.g., a loop antenna) or a spiral shape (e.g., a spiral antenna).

Alternatively, a microwave method (for example, a UHF band (860 to 960 MHz band), a 2.45 GHz band, or the like) can be employed as the signal transmission method in the semiconductor device. In this case, the shape such as the length of the conductive layer that functions as an antenna may be set as appropriate in consideration of the wavelength of the electromagnetic waves used in the transmission of signals. Examples of a chip-form semiconductor device 913 that has a conductive layer 912 that functions as an antenna and an integrated circuit that are formed over the organic compound layer 104 are shown in FIGS. 11A to 11D. For example, the shape of the upper surface of the conductive layer that functions as an antenna can be formed into a linear shape (for example, as a dipole antenna (see FIG. 11A)), a planar shape (for example, as a patch antenna (see FIG. 11B), a ribbon shape (see FIGS. 11C and 11D), or the like. The shape of the conductive layer functioning as an antenna is not limited to a linear shape but may be a curved shape, a meandering shape, or a combination thereof in consideration of the wavelength of an electromagnetic wave.

Figure 12A:
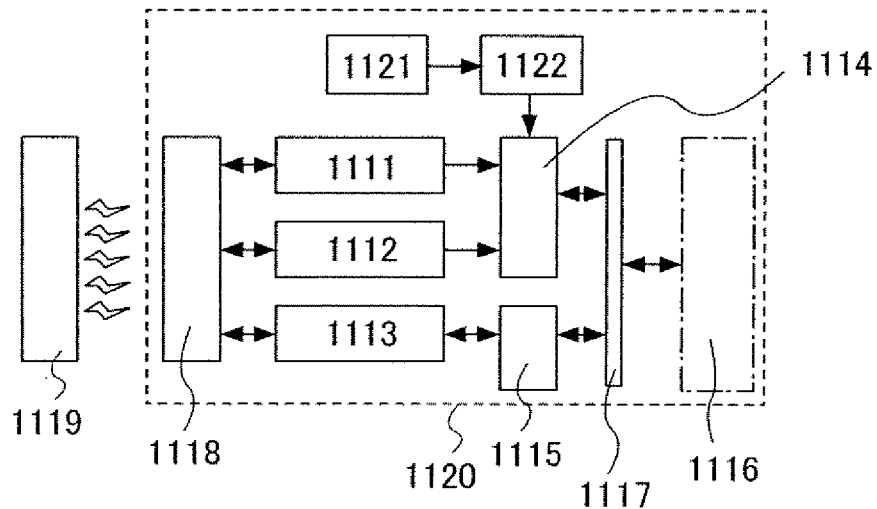
FIG. 12A is a drawing illustrating a structure of a semiconductor device of the present invention and FIG. 12B is a drawing illustrating an example of an electronic device.

A structure of the semiconductor device obtained through the above-mentioned steps is described with reference to FIG. 12A. As shown in FIG. 12A, a semiconductor device 1120 obtained according to the present invention functions to exchange data without contact, and includes a power supply circuit 1111, a clock generation circuit 1112, a data demodulation or modulation circuit 1113, a control circuit 1114 which controls another circuit, an interface circuit 1115, a memory circuit 1116, a data bus 1117, an antenna 1118, a sensor 1121, and a sensor circuit 1122.

The power supply circuit 1111 generates a variety of power to be supplied to each circuit in the semiconductor device 1120, based on an AC signal inputted from the antenna 1118. The clock generation circuit 1112 is a circuit that generates a variety of clock signals to be supplied to each circuit in the semiconductor device 1120, based on AC signals inputted from the antenna 1118. The data demodulation or modulation circuit 1113 has a function used to demodulate or modulate data exchanged with a communications device 1119. The control circuit 1114 functions to control the memory circuit 1116. The antenna 1118 functions to transmit and receive an electric wave. The communication device 1119 communicates with and controls the semiconductor device, and controls the processing of data thereof. The semiconductor device is not restricted to the above structure, and for example, another element such as a limiter circuit of power source voltage or hardware only for processing codes may be added.

The memory circuit 1116 has a memory element in which an inorganic compound layer, an organic compound layer, or a phase-change layer is interposed between a pair of conductive layers. It is to be noted that the memory circuit 1116 may have only a memory element in which an inorganic compound layer, an organic compound layer, or a phase-change layer is interposed between a pair of conductive layers, or the memory circuit 1116 may have a memory circuit that has another constitution. The memory circuit having another constitution corresponds, for example, to one or a plurality of the following: a DRAM, an SRAM, a FeRAM, a mask ROM, a PROM, an EPROM, an EEPROM, and a flash memory.

The sensor 1121 can be provided with a resistor element, a capacitive coupling element, an inductive coupling element, a photovoltaic element, a photoelectric conversion element, or a thermoelectric element, and formed using a semiconductor element such as a transistor, a thermistor, or a diode. The sensor circuit 1122 detects changes in impedance, reactance, inductance, voltage, or current; converts signals from analog to digital (A/D conversion); and outputs signals to the controller circuit 1114.

This embodiment mode can be freely combined with Embodiment Modes 1 to 3. For example, a flexible substrate provided with an antenna can be formed by the separation method shown in Embodiment Mode 2. Further, an integrated circuit is formed using a thin film transistor obtained by use of Embodiment Mode 1 or 3, and an element substrate which has been separated from a substrate and a flexible substrate over which an antenna obtained by use of the present embodiment can be attached together, so that electrical conductivity is achieved.

By the present invention, a semiconductor device that functions as a wireless chip having a processor circuit (hereinafter, also referred to as an IC chip, an IC tag, a processor chip, a wireless chip, a wireless processor, a wireless memory, and a wireless tag) can be formed. The application of a semiconductor device obtained by the present invention covers a wide range; for example, the semiconductor device can be provided and used in paper money, coins, securities, certificates, unregistered bonds, packaging containers, books, storage media, personal belongings, vehicles, food products, clothing, healthcare products, livingware, medicines, electronic appliances, and the like.

Figure 13A:
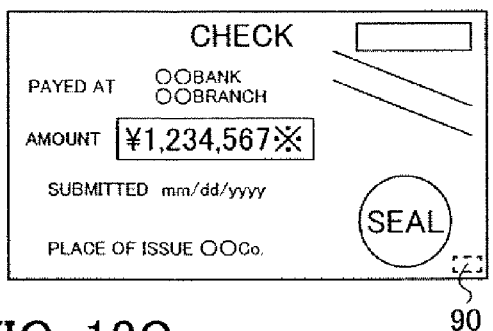
FIGS. 13A to 13F are drawings illustrating applications of a semiconductor device of the present invention.
Figure 13B:
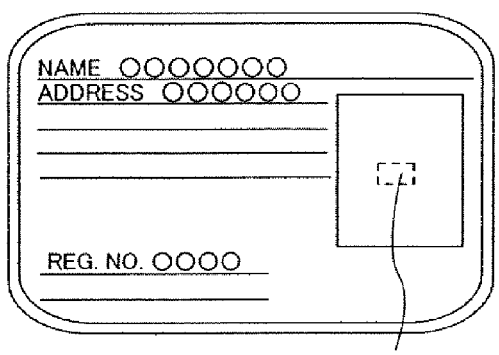
Figure 13C:
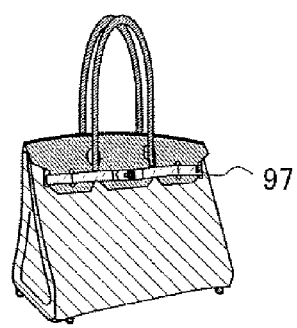
Figure 13D:
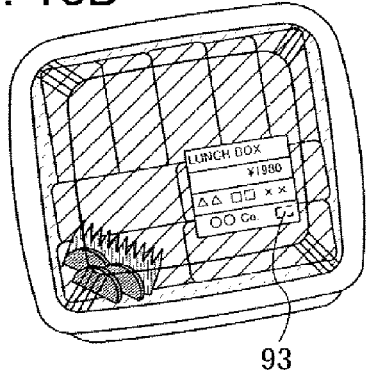
Figure 13E:
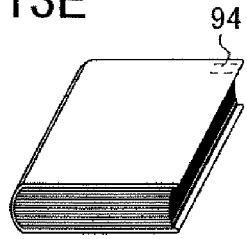
Figure 13F:
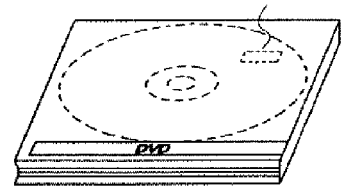
Figure 13G:
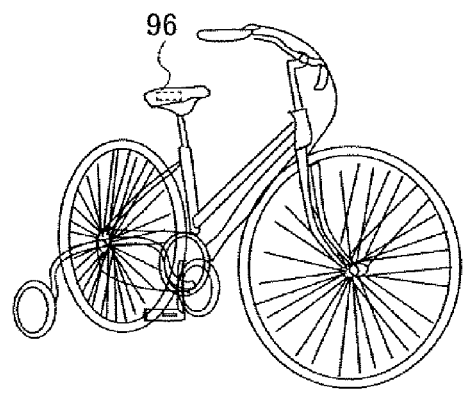

Paper money and coins are money distributed in the market and include currency (cash vouchers) available in a certain area in a similar way to money, and memorial coins and the like. Securities refer to checks, bonds, promissory notes, and the like, and an IC tag 90 that has a processor circuit can be provided therewith (see FIG. 13A). Certificates refer to driver's licenses, residence certificates, and the like, and an IC tag 91 can be provided therewith (see FIG. 13B). Personal belongings refer to bags, glasses, and the like, and a chip 96 that has a processor circuit can be provided therewith (see FIG. 13C). Bearer bonds refer to stamps, rice coupons, various kinds of gift vouchers, and the like. Packaging containers refer to wrapping paper for lunch boxes and the like, plastic bottles, and the like, and an IC tag 93 can be provided therewith (see FIG. 13D). Books refer to printed books, volumes, and the like and an IC tag 94 can be provided therewith (see FIG. 13E). Storage media refer to DVDs, video tapes, and the like, and an IC tag 95 can be provided therewith (see FIG. 13F). Vehicles refer to wheeled vehicles such as bikes and the like, ships, and the like, and an IC tag 97 can be provided therewith (referring to FIG. 13G). Food products refer to foods, beverages, and the like. Clothing refers to garments, footwear, and the like. Healthcare products refer to medical equipment, healthcare equipment, and the like. Household goods refer to furniture, lighting equipment, and the like. Medicines refer to pharmaceuticals, agrochemicals, and the like. Electronic devices refer to liquid crystal display devices, EL display devices, television devices (television sets, flat-screen television sets), cellular phones, and the like.

A semiconductor device obtained by use of the present invention is fixed to an article by being mounted to a printed circuit board, by being attached to a surface of the article, or by being embedded in the article. For example, for a book, the semiconductor device is embedded in the paper; for packaging made of an organic resin, the semiconductor device is embedded in the organic resin; the semiconductor device is fixed to each article. The semiconductor device of the present invention is the one by which a small, thin, and lightweight semiconductor device is realized; therefore, even after the semiconductor device has been fixed to an article, the design characteristics of the article itself are not affected. In addition, by provision of the semiconductor device obtained by use of the present invention in paper money, coins, securities, unregistered bonds, certificates, and the like, an authentication function can be provided; if this authentication function is utilized, forgery can be prevented. Furthermore, by provision of the semiconductor device obtained by use of the present invention in packaging containers, storage media, personal belongings, food products, clothing, household goods, electronic devices, and the like, improvement in the efficiency of systems, such as inspection systems and the like, can be realized.

Figure 12B:
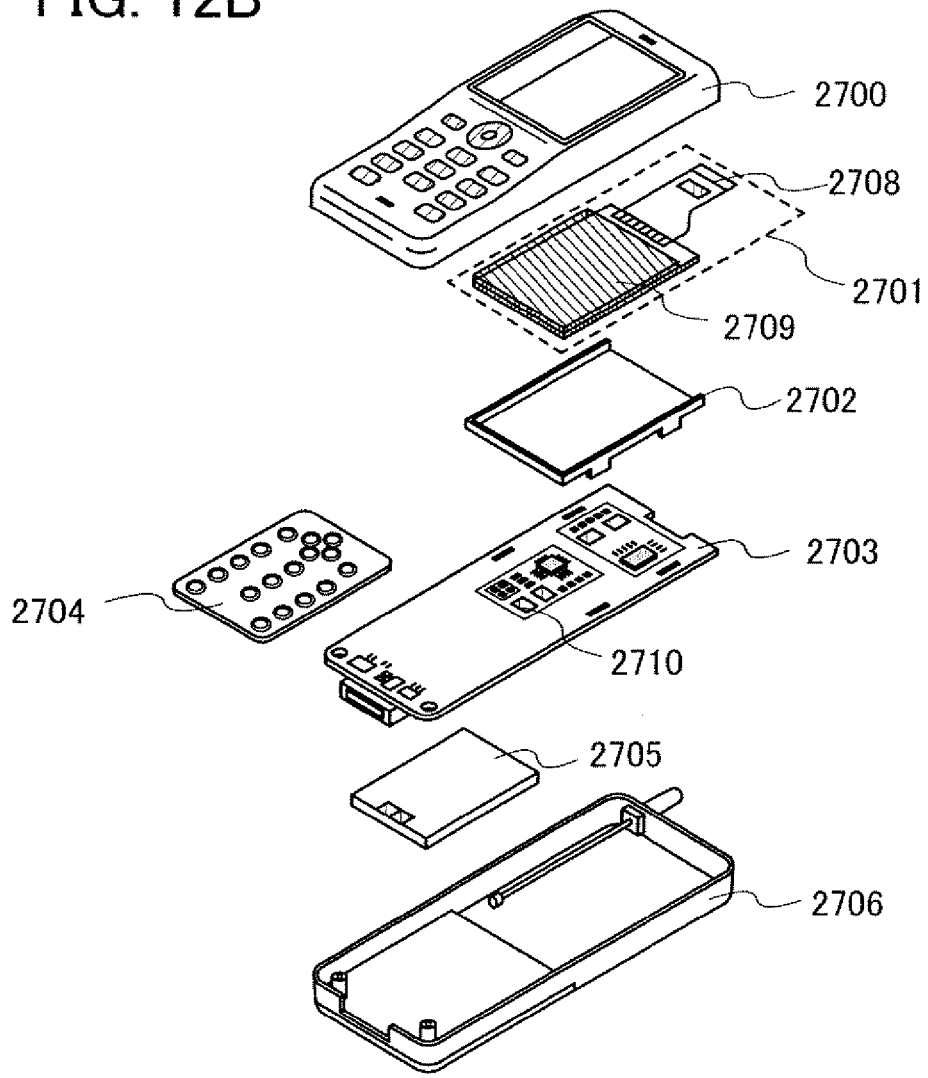

Next, one embodiment of an electronic device in which the semiconductor device obtained by use of the present invention is implemented will be described with reference to drawings. The example of an electronic device illustrated here is a cellular phone, which includes housings 2700 and 2706, a panel 2701, a housing 2702, a printed wiring board 2703, operation buttons 2704, and a battery 2705 (see FIG. 12B). The panel 2701 is implemented in the housing 2702 in such a way that it can be inserted or removed freely, and the printed wiring board 2703 is fitted to the housing 2702. The shape and dimensions of the housing 2702 are changed appropriately to conform to the shape and dimensions of the panel 2701 incorporated in the electronic device. A plurality of packaged semiconductor devices is mounted on the printed circuit board 2703, and out of the plurality of semiconductor devices, one can be used as a semiconductor device that is obtained by use of the present invention. The plurality of the semiconductor devices 2710 mounted on the printed circuit board 2703 functions as any of the following: a controller, a central processing unit (CPU), memory, a power supply circuit, an audio processing circuit, a transmitter-receiver circuit, or the like.

The panel 2701 is connected to the printed circuit board 2703 through a connective film 2708. The panel 2701, the housing 2702, and the printed wiring board 2703 are placed inside the housings 2700 and 2706 along with the operation buttons 2704 and the battery 2705. A pixel region 2709 included in the panel 2701 is positioned in such a way that it is visible through an aperture window provided in the housing 2700.

As described above, because a flexible substrate is used, the semiconductor device obtained by use of the present invention has the characteristics of being small in size, thin, and lightweight; by the aforementioned characteristics, limited space inside the housings 2700 and 2706 of the electronic device can be used effectively.

It is to be noted that the housings 2700 and 2706 indicate an example of the appearance and shape of a cellular phone, but electronic devices of the present embodiment mode can be changed into various modes depending on the functions and intended use.

Embodiment Mode 5

Here, an example in which a semiconductor device that has a semiconductor element formed using an amorphous semiconductor layer is manufactured will be described with reference to FIGS. 14A to 14D. For a semiconductor element formed using an amorphous semiconductor layer, there are a thin film transistor, a diode, a resistive element, and the like. Here, an example where a photoelectric conversion element that is formed by use of a diode is used for the semiconductor element that is formed by use of an amorphous semiconductor layer is shown.

Figure 14A:
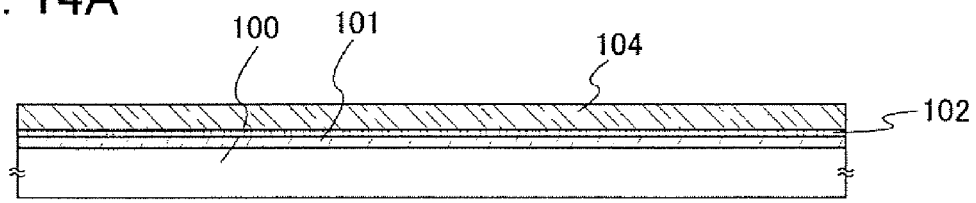
FIGS. 14A to 14D are cross-sectional views illustrating a method for manufacturing a semiconductor device of the present invention.
Figure 14B:
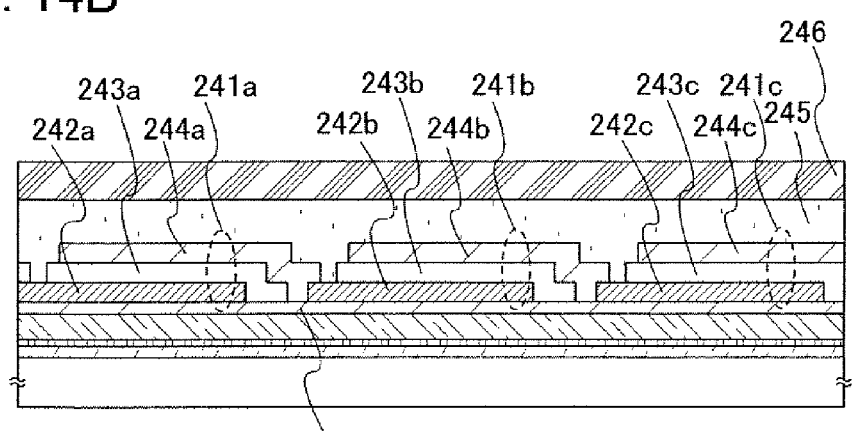
Figure 14C:
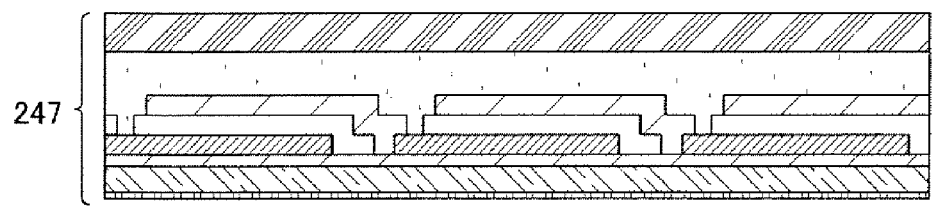
Figure 14C:
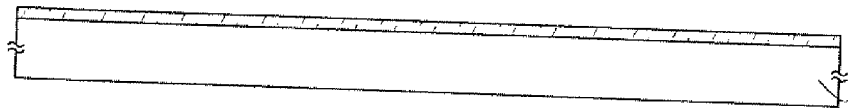
Figure 14D:
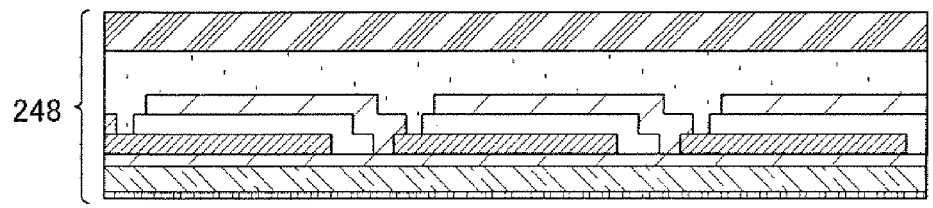

As in Embodiment Mode 1, a silicone layer 101 is formed over a substrate 100, the surface of the silicone layer 101 is subjected to plasma treatment to form a brittle layer, and an organic compound layer 104 is formed over the brittle layer 102. A cross-sectional process view of what is obtained after steps up to this stage have been completed is shown in FIG. 14A.

Next, an inorganic insulating layer 105 is formed over the organic compound layer 104, and first conductive layers 242a to 242c are formed over the inorganic insulating layer 105. Then, photoelectric conversion layers 243a to 243c are formed so that a part of the first conductive layers 242a to 242c is exposed. Subsequently, second conductive layers 244a to 244c are formed over the photoelectric conversion layers 243a to 243c, and over the exposed parts of the first conductive layers 242a to 242c. Here, a photoelectric conversion element 241a is made up of the first conductive layer 242a, the photoelectric conversion layer 243a, and the second conductive layer 244a. In addition, a photoelectric conversion element 241b is made up of the first conductive layer 242b, the photoelectric conversion layer 243b, and the second conductive layer 244b. Furthermore, a photoelectric conversion element 241c is made up of the first conductive layer 242c, the photoelectric conversion layer 243c, and the second conductive layer 244c. It is to be noted that, in order that the photoelectric conversion elements 241a to 241c may be connected in series, the second conductive layer 244a of the photoelectric conversion element 241a is formed so as to be in contact with the first conductive layer 242a of the second photoelectric conversion element 241b. Moreover, the second conductive layer 244b of the photoelectric conversion element 241b is formed so as to be in contact with the first conductive layer 242c of the third photoelectric conversion element 241c. The second conductive layer 244c of the photoelectric conversion element 241c is formed so as to be in contact with a first conductive layer of a fourth photoelectric conversion element.

When light enters from the organic compound layer 104 side, for the first conductive layers 242a to 242c, conductive layers that can make ohmic contact with the photoelectric conversion layers 243a to 243c formed of an amorphous semiconductor layer and that can transmit light are used. Typically, ITO, IZO, zinc oxide, indium tin oxide that includes silicon oxide, or the like can be used. Furthermore, the second conductive layers 244a to 244c are formed of a metal layer that can make ohmic contact with the photoelectric conversion layers 243a to 243c formed of an amorphous semiconductor layer. Typically, an element selected from aluminum (Al), titanium (Ti), chromium (Cr), nickel (Ni), molybdenum (Mo), palladium (Pd), tantalum (Ta), tungsten (W), platinum (Pt), and gold (Au) or an alloy material that contains one of these elements at a content of 50% or more can be used.

On the other hand, when light enters from a flexible substrate 246 side, a metal layer that can make ohmic contact with the photoelectric conversion layers 243a to 243c formed of an amorphous semiconductor layer is used for the first conductive layers 242a to 242c, and an electrode that can make ohmic contact with the photoelectric conversion layers 243a to 243c formed of an amorphous semiconductor layer and that can transmit light is used for the second conductive layers 244a to 244c.

The photoelectric conversion layers 243a to 243c can each be formed of a semiconductor layer that has an amorphous semiconductor layer. As typical examples of such a semiconductor layer, an amorphous silicon layer, an amorphous silicon-germanium layer, and a silicon carbide layer, or a PN junction layer and PIN junction layer of these layers can be given. In the present embodiment mode, the photoelectric conversion layers 243a to 243c are formed of amorphous silicon that has a PIN junction.

The flexible substrate 246 may be attached to the second conductive layers 244a to 244c using an adhesive 245.

Next, a stacked body 247 that includes the organic compound layer 104, the photoelectric conversion elements 241a to 241c, the adhesive 245 and the flexible substrate 246 is separated from the substrate 100. In this example, separation is performed in the brittle layer 102. Because the brittle layer 102 is weak, separation can be performed with relatively small force. It is to be noted that, after the stacked body 247 is separated from the substrate 100, the brittle layer 102 may be removed.

It is to be noted that, when a plurality of semiconductor devices is included in the stacked body 247 that includes the organic compound layer 104, the photoelectric conversion elements 241a to 241c, the adhesive 245, and the flexible substrate 246, the stacked body may be divided up and the plurality of semiconductor devices may be cut apart. By such steps, a plurality of semiconductor devices 248 can be manufactured by a single separation step.

By the above steps, a thin and flexible semiconductor device can be manufactured.

In addition, by combination of semiconductor devices manufactured according to the present embodiment mode, a variety of electronic devices can be manufactured. For the electronic devices, cellular phones; notebook computers; game machines; car navigation systems; portable audio devices; portable AV devices; cameras such as digital cameras, film cameras, instant cameras, and the like; room air conditioners; car air conditioners; ventilation and air conditioning systems; electric pots; CRT projection TVs; lighting devices; lighting systems; and the like can be given. Specific examples of these devices will be given below.

The photoelectric conversion element of the present embodiment mode is made to function as a light sensor, and the light sensor can be used as a sensor for optimal adjustment of display luminance and the brightness of a backlight and for a battery saver in cellular phones, notebook computers, digital cameras, game machines, car navigation systems, portable audio devices, and the like. In addition, the photoelectric conversion element of the present embodiment mode is made to function as a solar cell, and the solar cell can be provided in these devices as a battery. Because these semiconductor devices are small in size and a high level of integration can be achieved, miniaturization of electronic devices can be achieved.

Moreover, the photoelectric conversion element of the present embodiment mode is made to function as a light sensor, and the light sensor can be implemented in cellular phone key switches and portable AV devices as a sensor for ON/OFF control of a backlight LED or a cold-cathode tube or for a battery saver. By implementation of a light sensor in these devices, a switch can be turned OFF in lighted environments, and battery consumption due to operations of buttons for a long time can be reduced. Because the semiconductor devices of the present invention are small in size and a high level of integration can be achieved, miniaturization and reduction of power consumption of electronic devices can be achieved.

Furthermore, the photoelectric conversion element of the present embodiment mode is made to function as a light sensor, and the light sensor can be implemented in a camera, such as a digital camera, a film camera, an instant camera, or the like, as a sensor for flash control or aperture control. In addition, the photoelectric conversion element of the present embodiment mode is made to function as a solar cell, and the solar cell can be provided in these devices as a battery. Because these semiconductor devices are small in size and a high level of integration can be achieved, miniaturization of electronic devices can be achieved.

In addition, the photoelectric conversion element of the present embodiment mode is made to function as a light sensor, and the light sensor can be implemented in a room air conditioner, a car air conditioner, or a ventilation and air conditioning system as a sensor used to control airflow and temperature. Because the semiconductor devices of the present invention are small in size and a high level of integration can be achieved, miniaturization of electronic devices can be achieved. Conservation of electric power can be achieved.

Furthermore, the photoelectric conversion element of the present embodiment mode is made to function as a light sensor, and the light sensor can be implemented in an electric pot as a sensor used to control the temperature at which what is inside the electric pot is kept warm. By the light sensor of the present embodiment mode, the temperature at which what is inside the electric pot is kept warn can be set low after the lights in a room have been turned off. Moreover, because the light sensor is small and thin, the light sensor can be implemented in a given location, and, as a result, conservation of electric power can be achieved.

In addition, the photoelectric conversion element of the present embodiment mode is made to function as a light sensor, and the light sensor can be implemented in a display of a CRT projection TV as a sensor used for scan line position adjustment (alignment of RGB scan lines (digital auto convergence)). Because the semiconductor devices of the present invention are small in size and a high level of integration can be achieved, miniaturization of electronic devices can be achieved and a sensor can be implemented in a given region. Furthermore, high-speed automatic control of a CRT projection TV becomes possible.

In addition, the photoelectric conversion element of the present embodiment mode is made to function as a light sensor, and the light sensor can be implemented in various types of household lighting equipment, outdoor lamps, streetlights, uninhabited public systems, stadiums, automobiles, calculators, and the like as a sensor used for ON/OFF control of various types of lighting devices and lighting systems. By the sensor of the present invention, conservation of electric energy can be achieved. Moreover, by the photoelectric conversion element of the present embodiment mode being made to function as a solar cell and being provided in these electronic devices as a battery, the size of the battery can be thinned, and miniaturization of electronic devices can be achieved.

Embodiment Mode 6

In this embodiment mode, a method for manufacturing a substrate having a functional layer with a high yield is provided. FIGS. 20A to 20D show cross-sectional views of steps of forming a substrate having a functional layer. In this embodiment mode, as the layer having a functional layer, an optical layer such as a colored layer, a color conversion filter, or a hologram color filter can be given. Here, a colored layer is used as the optical layer, to describe this embodiment mode.

Figure 20A:
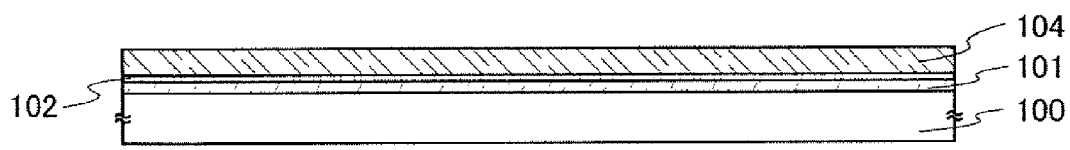
FIGS. 20A to 20D are cross-sectional views illustrating a method for manufacturing a substrate having a functional layer of the present invention.
Figure 20B:
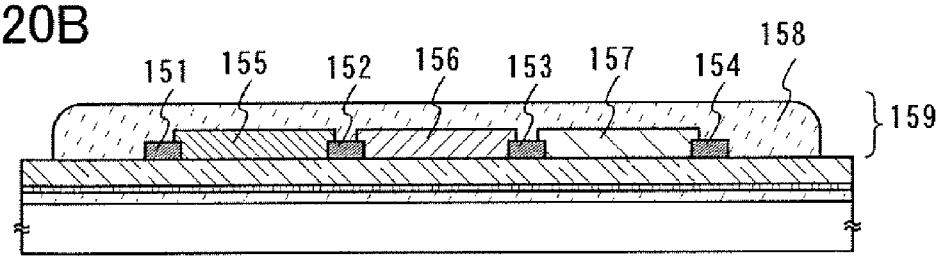

As shown in FIG. 20A, as in Embodiment Mode 1, a silicone layer 101 is formed over a substrate 100, and the surface of the silicone layer 101 is subjected to plasma treatment to form a brittle layer 102. Then, an organic compound layer 104 is formed over the brittle layer 102. FIG. 20A shows a cross-sectional view at a stage where the steps up to here are completed. Note that an inorganic insulating layer may be formed between the brittle layer 102 and the organic compound layer 104.

Then, colored layers, and an insulating layer 158 for covering the colored layers are formed over the organic compound layer 104. Here, light shielding layers 151 to 154, a red colored layer 155, a blue colored layer 156, and a green colored layer 157 are shown as the colored layers. A functional layer 159 can be formed using the colored layers and the insulating layer 158.

As a method for forming the colored layers, an etching method using a colored resin, a color resist method using a color resist, a staining method, an electrodeposition method, a micelle electrolytic method, an electrodeposition transfer method, a film dispersion method, an inkjet method (droplet discharge method), or the like can be appropriately used.

Here, a color filter is formed by an etching method using a photosensitive resin in which colorant is dispersed. First, a photosensitive acrylic resin in which a black colorant is dispersed is applied to the organic compound layer 104 by a coating method. Subsequently, after the acrylic resin is dried and temporarily baked, exposure and development are performed, and then, the acryl is hardened by heating at from 200° C. to 350° C., preferably, from 200° C. to 300° C.; here, 220° C. to form the light shielding layers 151 to 154 with a film thickness of 0.5 μm to 1.5 μm.

Next, a photosensitive acrylic resin in which a red colorant, a green colorant, or a blue colorant is dispersed is applied to form the red colored layer 155, the blue colored layer 156, and the green colored layer 157, each having a film thickness of 1.0 μm to 2.5 μm, by a process similar to that of the light shielding layers 151 to 154.

Through the above steps, the colored layers in each of which the width is controlled can be easily formed.

It is to be noted that the red colored layer indicates a colored layer that transmits red light (light having a peak wavelength in the vicinity of 650 nm), the green colored layer indicates a colored layer that transmits green light (light having a peak wavelength in the vicinity of 550 nm), and the blue colored layer indicates a colored layer that transmits blue light (light having a peak wavelength in the vicinity of 450 nm).

An insulating composition is applied to an exposed portion of the organic compound layer 104, the colored layers 155 to 157, and the light shielding layers 151 to 154 by a coating method, and heating and baking are performed, thereby forming the insulating layer 158 for covering the colored layers. The insulating layer 158 can be formed with a method and material similar to those for the interlayer insulating layer 118 in Embodiment Mode 1. Furthermore, it is preferable that the insulating layer 158 function as a protective layer of the colored layers (see FIG. 20B).

Figure 20C:
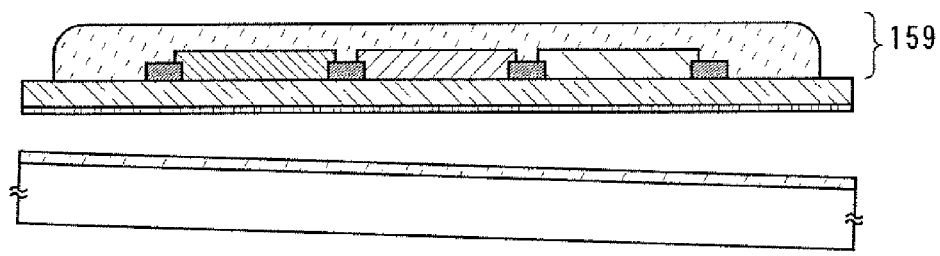

Subsequently, as shown in FIG. 20C, the stacked body including the organic compound layer 104 and the functional layer 159 is separated from the substrate 100.

Figure 20D:
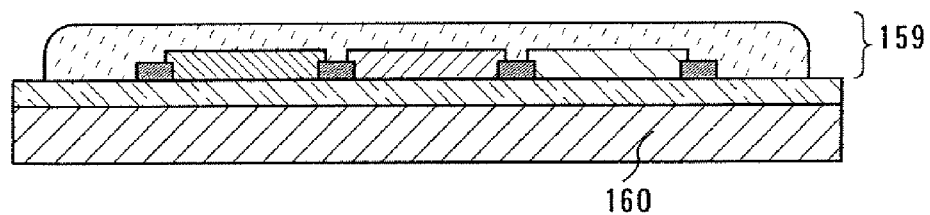

Then, as shown in FIG. 20D, after the brittle layer 102 is removed, a flexible substrate 160 is attached to the organic compound layer 104. Here, the flexible substrate 160 is fixed to the organic compound layer 104 by thermocompression bonding. Alternatively, the flexible substrate 160 may be fixed to the organic compound layer 104 using an adhesive.

Through the above steps, the flexible substrate having the functional layer 159 can be formed with a high yield.

Embodiment Mode 7

A liquid crystal display device and a light-emitting device obtained according to the present invention can be used for a variety of modules (active matrix liquid crystal modules and active matrix EL modules). That is, the present invention can be applied to all electronic devices incorporating them in display portions.

As those kinds of electronic devices, a video camera, a digital camera, a head mounted display (goggle-type displays), a car navigation systems, a projector, a car stereos, a personal computer, a portable information terminal (such as a mobile computer, a cellular phone, and an electronic book reader); and the like can be given. Examples of these devices are illustrated in FIGS. 15A to 15C.

Figure 15A:
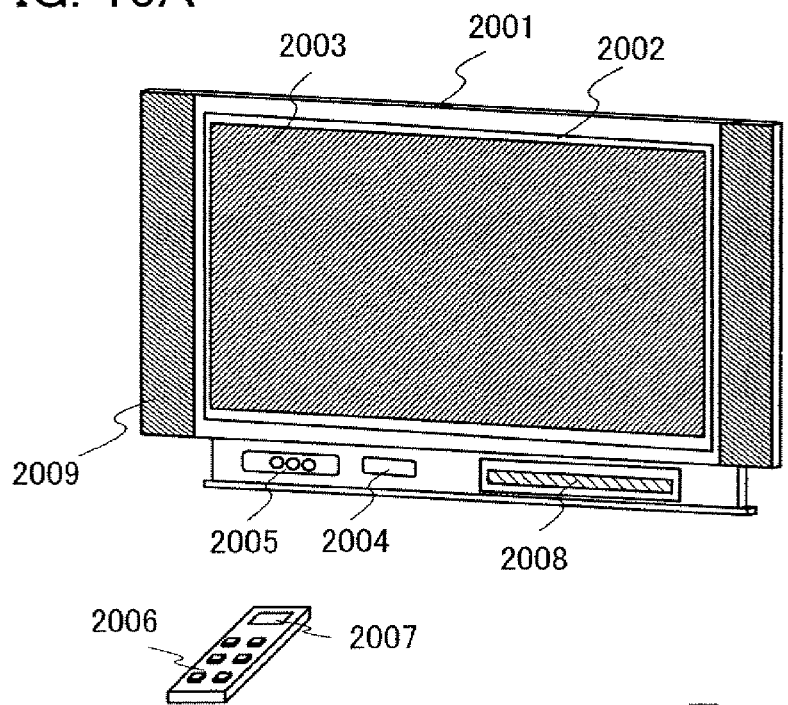
FIGS. 15A to 15C are drawings illustrating an example of electronic appliances.
Figure 15B:
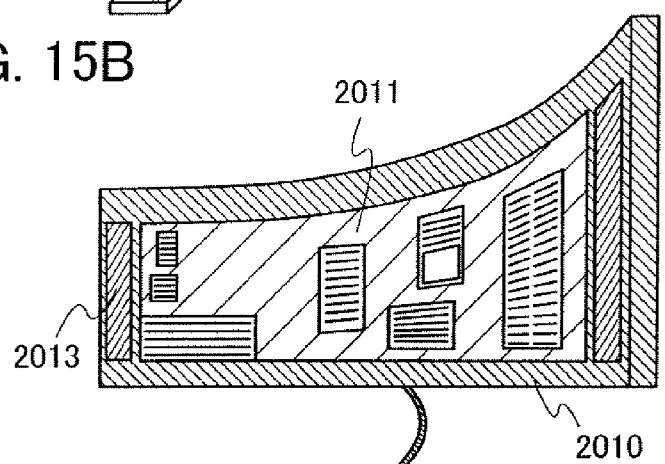
Figure 15C:
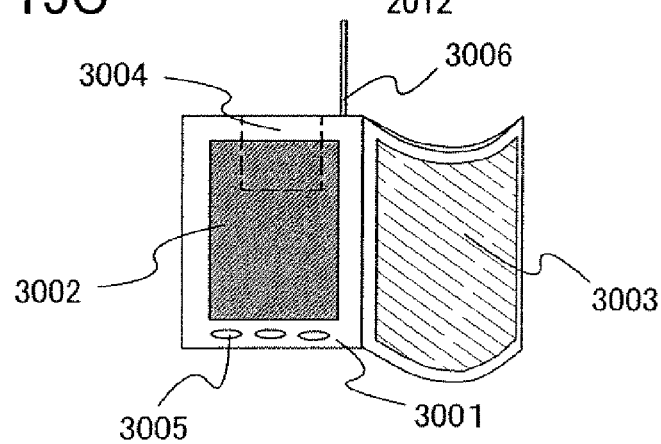

FIGS. 15A and 15B illustrate a television device. A display panel may employ any of the following modes: a case where only a pixel portion is formed and a scan line driver circuit and a signal line driver circuit are mounted by a TAB method; a case where only a pixel portion is formed and a scan line driver circuit and a signal line driver circuit are mounted by a COG method; a case where a thin film transistor is formed, a pixel portion and a scan line driver circuit are formed over the same substrate, and a signal line driver circuit is separately mounted as a driver IC; a case where a pixel portion, a signal line driver circuit, and a scan line driver circuit are formed over the same substrate; and the like.

As a structure of another external circuit, a video signal amplifier circuit that amplifies a video signal among signals received by a tuner, a video signal processing circuit that converts the signal outputted from the video signal amplifier circuit into a chrominance signal corresponding to each color of red, green, and blue, a control circuit that converts the video signal into a signal which meets the input specification of a driver IC, and the like are provided on an input side of the video signal. The control circuit outputs signals to both a scan line side and a signal line side. In a case of digital driving, a signal dividing circuit may be provided on the signal line side and an input digital signal may be divided into a plurality of pieces to be supplied.

In signals that are received by a tuner, audio signals are transmitted to an audio signal amplifier circuit, and the output thereof is supplied to a speaker through an audio signal processing circuit. A control circuit receives control information of a receiving station (reception frequency) or sound volume from an input portion and transmits a signal to the tuner or the audio signal processing circuit.

A television device can be completed by incorporation of a display module into a chassis as illustrated in FIGS. 15A and 15B. A display panel including components up to an FPC is also referred to as a display module. A main screen 2003 is formed using the display module, and a speaker portion 2009, an operation switch, and the like are provided as its accessory equipment. In such a manner, a television can be completed.

As illustrated in FIG. 15A, a display panel 2002 using display elements is incorporated into a chassis 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. The television set can be operated by switches incorporated in the chassis or by a remote controller 2006 separated from the main body. A display portion 2007 that displays information to be outputted may also be provided in this remote controller.

Further, the television device may include a sub-screen 2008 formed using a second display panel to display channels, volume, or the like, in addition to the main screen 2003. In this structure, the main screen 2003 may be formed of a light-emitting display panel while the sub screen may be formed of a liquid crystal display panel. Alternatively, the main screen 2003 may be formed of a liquid crystal display panel while sub screen may be formed of a light-emitting display panel, and the sub screen may be capable of blinking.

FIG. 15B shows a television device which has a large display portion, for example, 20-inch to 80-inch display portion and includes a housing 2010, a keyboard portion 2012 which is an operation portion, a display portion 2011, a speaker portion 2013, and the like. The present invention is applied to manufacturing of the display portion 2011. In the display portion of FIG. 15B, because a flexible substrate that can be curved is used, the television device comes to be a curved television device. Since the shape of the display portion can be designed freely as described above, a television device having a desired shape can be manufactured.

The display device can be formed through a simplified process in accordance with the present invention; therefore, cost reduction can also be achieved. Hence, even a television device with a large screen display portion can be formed at low cost by applying the present invention.

As a matter of course, the present invention is not limited to the television device. The present invention can be applied to various applications such as monitors of personal computers, particularly large-sized display media typified by information display boards at train stations, airports, or the like, and advertising display boards on the street.

In addition, FIG. 15C shows a portable information terminal (electronic book reader) and includes a main body 3001, display portions 3002 and 3003, a storage medium 3004, operation switches 3005, an antenna 3006, and the like.

By use of a flexible substrate, making the portable information terminal thinner and more lightweight can be achieved.

This embodiment mode can be freely combined with any one of Embodiment Modes 1 to 3.

Embodiment Mode 8

In the present embodiment mode, an example in which an electrophoretic display device which is capable of being used for the display portion described in Embodiment Mode 6 will be described. Typically, the electrophoretic display device is applied to the display portion 3002 or the display portion 3003 of a portable book (electronic book reader) that is shown in FIG. 15C.

The electrophoretic display device (electrophoretic display) is also referred to as electronic paper and has advantages in that it has the same level of readability as regular paper, it has less power consumption than other display devices, and it can be set to have a thin and light form.

With the electrophoretic display, various modes can be considered; however, electrophoretic displays are displays, which include a plurality of microcapsules that each include first particles that have positive charge, second particles that have negative charge, and a solvent, and in which the particles within the microcapsules are moved in opposite directions from each other by application of an electric field to the microcapsules and only the color of particles concentrated on one side is displayed. It is to be noted that the first particles and the second particles each have a pigment and are particles that do not move unless in the presence of an electric field. Moreover, the colors of the first particles and the second particles are set to be different (this includes particles that are colorless).

In this way, an electrophoretic display is a display that uses the so-called dielectrophoretic effect by which first particles or second particles that have a high dielectric constant move to a region with a high electric field. The electrophoretic display does not require a polarizing plate and an opposite substrate, which are required in a liquid crystal display device, so that the thickness and weight thereof can be cut in half.

A substance in which the aforementioned microcapsules are diffused in a solvent is referred to as electronic ink. This electronic ink can be printed over the surface of glass, plastic, cloth, paper, and the like. Furthermore, by use of a color filter or particles that have a pigment, color display is possible, as well.

In addition, if a plurality of the aforementioned microcapsules is arranged, as appropriate, over a substrate so as to be interposed between a pair of electrodes, a display device can be completed, and display can be performed with application of an electric field to the microcapsules. For example, the active matrix substrate obtained with Embodiment Mode 1 or Embodiment Mode 2 can be used. Although electronic ink can be printed directly onto a plastic substrate, when the display device is an active matrix type of device, it is preferable that elements and electronic ink be formed over a glass substrate, rather than elements being formed over a plastic substrate that is easily affected by heat and degraded by organic solvents, and separated from the glass substrate according to the separation method of Embodiment Mode 1 or Embodiment Mode 2.

It is to be noted that the first particles and the second particles in the microcapsules may each be formed of a single type of material selected from a conductive material, an insulating material, a semiconductor material, a magnetic material, a liquid crystal material, a ferroelectric material, an electroluminescent material, an electrochromic material, and a magnetophoretic material or formed of a composite material of any of these.

The present embodiment mode can be freely combined with any one of Embodiment Mode 1, Embodiment Mode 2, or Embodiment Mode 6.

Embodiment 1

In this embodiment, a manufacturing step of a flexible liquid crystal display device is described with reference to FIGS. 16A to 16G, FIGS. 17A to 17C, and FIGS. 18A and 18B. FIGS. 16A to 16G, FIGS. 17A to 17C, and FIGS. 18A and 18B show manufacturing steps of a liquid crystal display device.

Figure 16A:
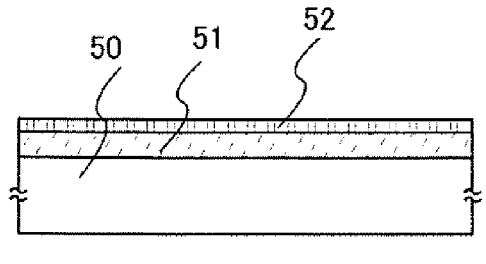
FIGS. 16A to 16G are cross-sectional views illustrating a method for manufacturing a semiconductor device of the present invention.

As shown in FIG. 16A, a silicone layer 51 is formed over a first substrate 50. Then, the surface of the silicone layer 51 is subjected to plasma treatment to form a brittle layer 52. Here, a glass substrate is used as the first substrate 50, and PSB-K31 (a composition including siloxane polymer by 20 to 40% and 3-methoxy-3-methyl-1-butanol by 60 to 80%) produced by Toray Industries, Inc., is applied and baked at 200° C. for 30 minutes to form the silicone layer 51 with a film thickness of from 900 nm to 1000 nm. Furthermore, the surface of the silicone layer 51 is subjected to oxygen plasma treatment, thereby forming the brittle layer 52 which is obtained by oxidizing organic groups at the surface of the silicone layer 51.

Figure 16D:
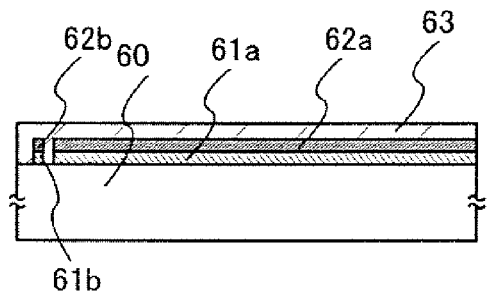
Figure 16B:
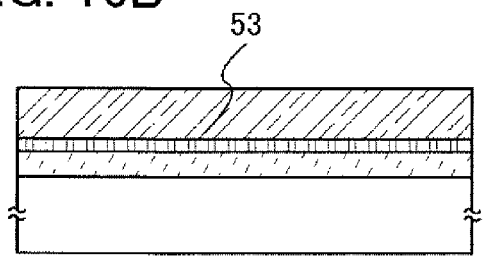

Next, as shown in FIG. 16B, an organic compound layer 53 is formed over the brittle layer 52 of the first substrate 50. Here, polyimide is applied with a spin coater and heated at a temperature of 300° C. for 30 minutes, thereby forming a polyimide layer as the organic compound layer 53.

Figure 16E:
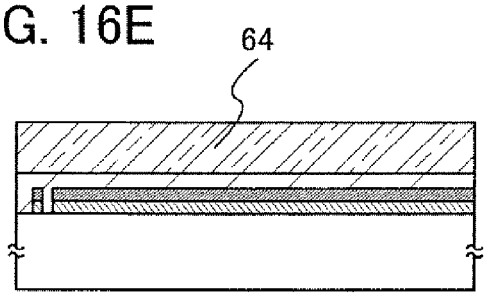
Figure 16C:
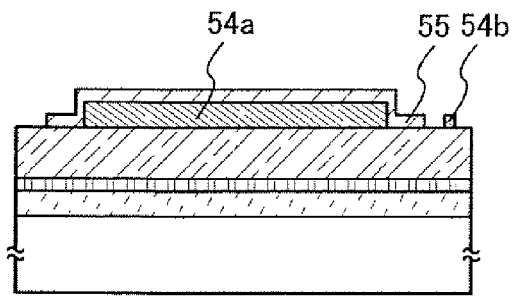

Subsequently, as shown in FIG. 16C, an element layer 54a is formed over the organic compound layer 53. In this embodiment, as shown in Embodiment Mode 1, a thin film transistor and a pixel electrode which is connected to the thin film transistor is formed for the element layer 54a. Further, an alignment marker 54b is formed using a pan of wirings of the element layer 54a.

Then, an alignment layer 55 is formed over the element layer 54a and the organic compound layer 53. As the alignment layer 55, polyimide is printed by a printing method, heated at 250° C. for one hour and a half, and then, rubbing treatment is performed thereon in the X-axis direction to form the alignment layer.

On the other hand, as shown in FIG. 16D, a molybdenum layer 61a and an alignment marker 61b are formed over a second substrate 60, molybdenum oxide layers 62a and 62b are formed over the surface of the molybdenum layer 61a and the alignment marker 61b, and an insulating layer 63 is formed over the molybdenum oxide layers 62a and 62b.

Here, a glass substrate is used as the second substrate 60. As the molybdenum layer 61a and the alignment marker 61b, a molybdenum layer with a thickness of 10 nm is formed over the second substrate 60 by sputtering a molybdenum target with argon. Then, a part of the molybdenum layer is etched using a solution including phosphoric acid, acetic acid, and nitric acid with the use of a resist mask formed through a photolithography process, so that the molybdenum layer 61a and the alignment marker 61b are formed. Next, the resist mask is removed, an oxide layer at the surface of the molybdenum layer 61a and the alignment marker 61b is removed by a fluoric acid, and then, dinitrogen monoxide plasma treatment is performed thereto, thereby forming the molybdenum oxide layers 62a and 62b over the surface of the molybdenum layer 61a and the alignment marker 61b, respectively. Subsequently, silnane, dinitrogen monoxide, and ammonia are used to form a silicon nitride layer with a thickness of 100 nm as the insulating layer 63.

Next, as shown in FIG. 16E, an organic compound layer 64 is formed over the insulating layer 63. Here, the organic compound layer 64 is formed in a similar manner to the organic compound layer 53 shown in FIG. 1B.

Figure 16F:
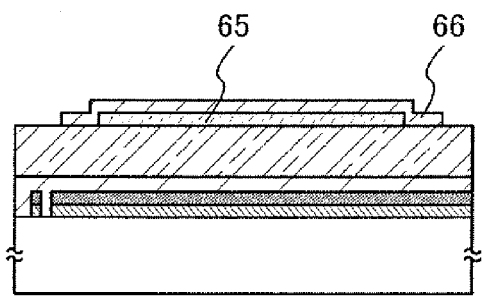

Then, as shown in FIG. 16F a colored Layer 65 is former over the organic compound layer 64. Here, the colored layer 65 includes a red colored layer; a blue colored layer; a green colored layer; and a black colored layer; a protective layer formed over the red colored layer, the blue colored layer, the green colored layer, and the black colored layer; and a pixel electrode formed over the protective layer. It is to be noted that the red colored layer indicates a colored layer that transmits red light (light having a peak wavelength in the vicinity of 650 nm), the green colored layer indicates a colored layer that transmits green light (light having a peak wavelength in the vicinity of 550 nm), and the blue colored layer indicates a colored layer that transmits blue light (light having a peak wavelength in the vicinity of 450 nm).

Then, an alignment layer 66 is formed over the colored layer 65 and the organic compound layer 64. As the alignment layer 66, polyimide is printed by a printing method, and heated at 250° C. for one and a half hours, and then, rubbing treatment is performed thereon in the Y-axis direction, so that the alignment layer is formed.

Figure 16G:
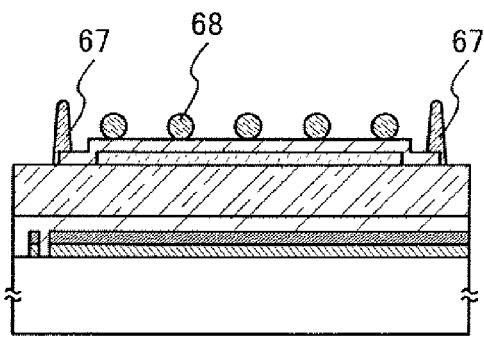

Subsequently, after cleaning the surface of the alignment layer 66, as shown in FIG. 16G, a sealant 67 is formed over the alignment layer 66. At this time, a material for the sealant is discharged from a dispenser or a droplet discharging apparatus so as to provide a cut portion to be a liquid crystal inlet, whereby the sealant is formed. Further, a spherical spacer 68 is dispersed over the alignment layer 66. Here, an epoxy resin is used for the sealant.

Figure 17A:
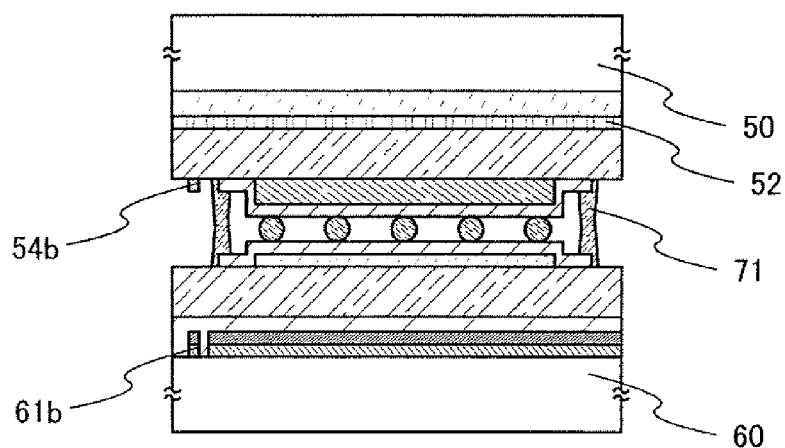
FIGS. 17A to 17C are cross-sectional views illustrating a method for manufacturing a semiconductor device of the present invention.

Then, as shown in FIG. 17A, the first substrate 50 is attached to the second substrate 60. Specifically, the first substrate 50 is attached to the second substrate 60 with the sealant 67 while the alignment marker 54b formed over the first substrate 50 and the alignment marker 61b formed over the second substrate 60 are adjusted. Here, the first substrate 50 and the second substrate 60 are heated at 160° C. for three hours while pressure is applied thereto so that a sealant 71 is cured; therefore, the first substrate 50 is attached to the second substrate 60.

At this time, since the silicone layer 51 and the brittle layer 52 which are formed over the first substrate 50 transmit light, alignment of the alignment markers 54b and 61b is easy. As a result, the first substrate 50 can be easily attached to the second substrate 60.

Figure 17B:
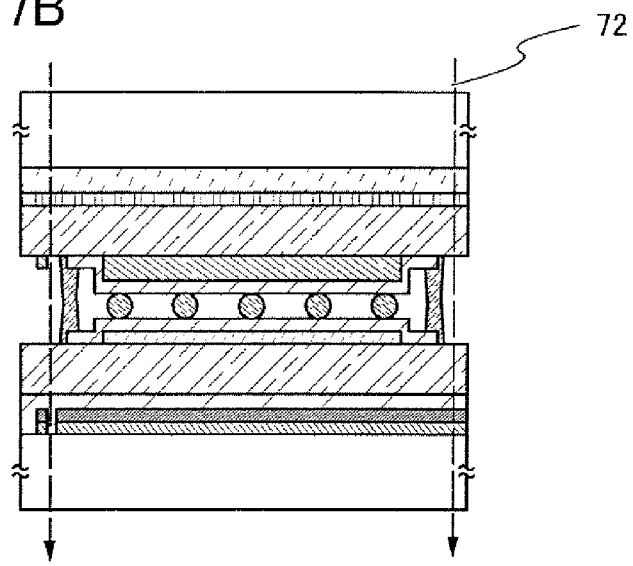
Figure 17C:
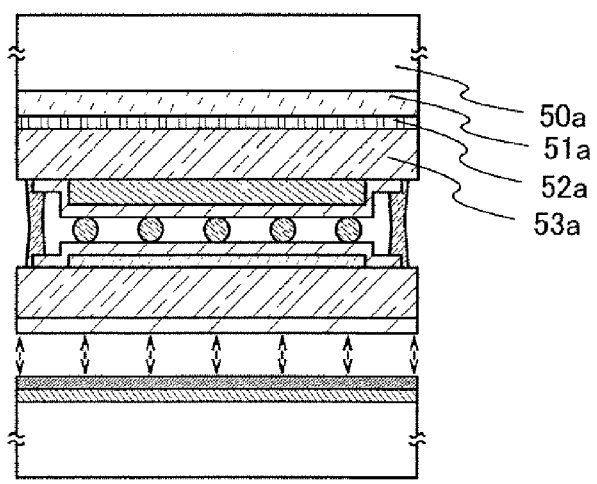

Subsequently, as shown in FIG. 17B, the first substrate 50 and the second substrate 60 are divided up using a scriber. Here, the first substrate 50 and the second substrate 60 are divided up at the outside of the sealant 71. By cutting with the use of the scriber, as shown in FIG. 17C, in the second substrate 60, separation occurs in the vicinity of the molybdenum oxide layers 62a and 62b. This is because the molybdenum oxide layers 62a and 62b formed over the second substrate 60 are easily separated with a physical action compared to the brittle layer 52 formed over the first substrate 50 Therefore, the second substrate 60 is separated from the first substrate 50 with the physical action of the scriber. Specifically, separation occurs at the interface between the molybdenum oxide layers 62a and 62b and the insulating layer 63.

It is to be noted that since separation is less likely to occur at the interface between the silicone layer 51 and the brittle layer 52 than at the interface between the molybdenum oxide layers 62a and 62b and the insulating layer 63, separation does not occur at the interface between the silicone layer 51 and the brittle layer 52 by an external force with the scriber.

Therefore, in the separation process, the organic compound layers 53 and 64, the element layer 54a, and the colored layer 65, and the like can be held in the first substrate 50; therefore, steps to be performed later such as injection of liquid crystal, sealing, and the like can be easily performed. As a result, yield can be improved, and throughput can be improved.

Note that the first substrate 50 which is divided with the scriber is referred to as a first substrate 50a; the silicone layer 51 which is divided with the scriber is referred to as a silicone layer 51a; the brittle layer 52 which is divided with the scriber is referred to as a brittle layer 52a; and the organic layer 53 which is divided with the scriber is referred to as an organic compound layer 53a.

Then, as shown in FIG. 18C, a liquid crystal material 73 is injected through a liquid crystal inlet (not shown in the drawing) among the alignment layer 55 formed over the first substrate 50, the alignment layer 66 formed over the organic compound layer 64, and the sealant 71. Subsequently, a material for sealing is applied to the liquid crystal inlet and cured so as to form a sealing material (not shown in the drawing), and the liquid crystal between the second substrate 60 and the organic compound layer 64 is sealed with the sealant and the sealing material.

Figure 18A:
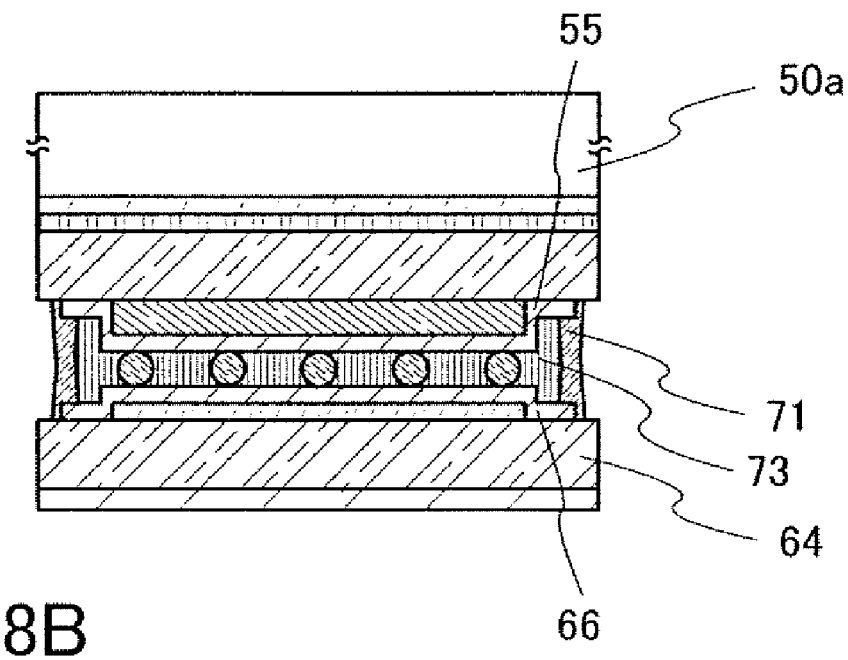
FIGS. 18A and 18B are cross-sectional views illustrating a method for manufacturing a semiconductor device of the present invention.
Figure 18B:
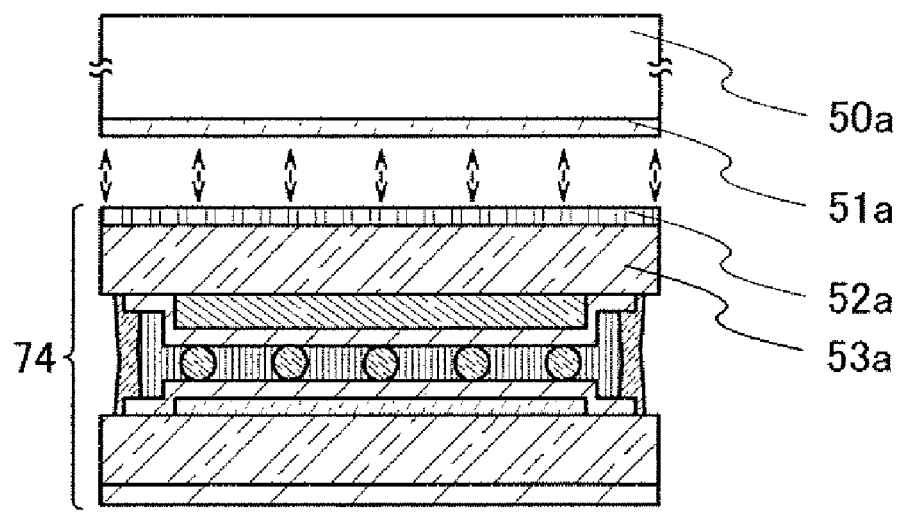

Then, as shown in FIG. 18B, the first substrate 50a is separated from the organic compound layer 53a. Specifically, the separation is performed at the interface between the brittle layer 52a and the silicone layer 51a. After this, the brittle layer 52 may be removed.

According to the above steps, a flexible liquid crystal display device 74 can be manufactured. In this embodiment, since the silicone layer and the brittle layer formed therover transmit light, alignment of the alignment markers 54b and 61b is easily performed. Therefore, the first substrate 50 can be easily attached to the second substrate 60. Furthermore, by using separation interfaces whose peeling properties are different (here, using the interface between the silicone layer and the brittle layer in which separation is less likely to occur than at the interface between the molybdenum layer and the insulating layer, and the molybdenum layer and the insulating layer), a flexible liquid crystal display device can be manufactured with a high yield. Moreover, throughput in a manufacturing step of the flexible liquid crystal display device can be improved.

Embodiment 2

Figure 19:
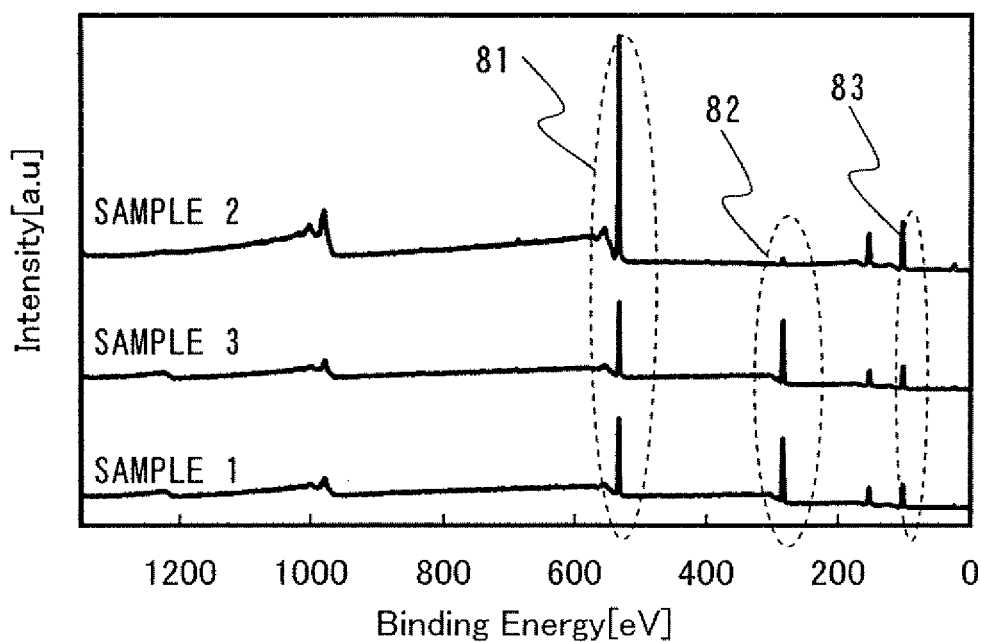
FIG. 19 is a drawing illustrating a result of measuring a Si bond level at the surface of a silicone layer by X-ray photoelectron Spectroscopy.

In this embodiment, FIG. 19 shows a result of measuring a Si bond level at the surface of a silicone layer and a Si bond level at the surface of the silicone layer when separation has been performed, by X-ray photoelectron Spectroscopy (XPS).

PSB-K31 (a composition including siloxane polymer by 20 to 40% and 3-methoxy-3-methyl-1-buthanol by 60 to 80%) produced by Toray Industries, Inc., was applied by a spin coating method and baked at 200° C. for 30 minutes, so that a silicone layer was formed. Then, after the surface of the silicone layer had been subjected to oxygen plasma treatment for 60 seconds, polyimide was applied to the surface of the silicone layer by a spin coating method, and baked at 300° C. for one hour. After that, a tape was attached to the surface of the polyimide, and then polyimide was separated from the silicone layer.

Then, the surface of the silicone layer (sample 1), the surface of the silicone layer which had been subjected to plasma treatment (sample 2), and the surface of the silicone layer from which polyimide had been separated (sample 3) were measured by X-ray photoelectron spectroscopy. FIG. 19 shows a measurement result of the sample 1 to sample 3.

In the spectrum of FIG. 19, comparing the sample 1 and sample 2, as a peak 81 of oxygen bonds of the sample 2 is relatively increased, a peak 82 of carbon bonds is relatively decreased. A peak 83 of silicon bonds is increased in the sample 2; however, the increase is not very big. Therefore, it is apparent that carbon at the surface of the silicone layer is oxidized by oxygen plasma treatment and removed from the surface of the silicone layer.

Furthermore, comparing the sample 1 and sample 3, the samples 1 and 3 have almost the same peak. This shows that when polyimide was separated from the silicone layer, the surface of the silicone layer that had been oxidized by oxygen plasma treatment was also separated. That is, an organic group at the surface of the silicone layer was oxidized and weakened by oxygen plasma treatment, and flexibility and bonding strength of the surface of the silicone layer was reduced. At this time, by adding external force to separate polyimide from the silicone layer, the oxidized region becomes a separation layer, and brittle fracture proceeds and separation occurs at the interface between the layer which has been oxidized and weakened and the layer which is not oxidized.

This application is based on Japanese Patent Application serial no. 2007-224043 filed with Japan Patent Office on Aug. 30, 2007, the entire contents of which are hereby incorporated by reference.

What is claimed is:

1. A method for manufacturing a semiconductor device comprising the steps of:
   forming a silicone layer over a substrate;
   performing a plasma treatment to a surface of the silicone layer to form a brittle layer;
   forming an organic compound layer over the brittle layer;
   forming a semiconductor layer over the organic compound layer; and
   after forming a semiconductor element using the semiconductor layer, separating a stacked body including the organic compound layer and the semiconductor element from the substrate at the brittle layer.

2. A method for manufacturing a semiconductor device according to claim 1, wherein the semiconductor layer is an amorphous semiconductor layer.

3. A method for manufacturing a semiconductor device according to claim 1, wherein the semiconductor layer is a microcrystalline semiconductor layer.

4. A method for manufacturing a semiconductor device according to claim 1, wherein the semiconductor layer has an organic compound.

5. A method for manufacturing a semiconductor device according to claim 1, wherein the substrate is a glass substrate, a ceramic substrate, or a quartz substrate.

6. A method for manufacturing a semiconductor device according to claim 1, wherein the brittle layer is a silicon oxide layer.

7. A method for manufacturing a semiconductor device according to claim 1, wherein the semiconductor layer includes ZnO.

8. A method for manufacturing a semiconductor device according to claim 1, wherein the semiconductor layer includes an oxide of zinc-gallium-indium.

9. A method for manufacturing a semiconductor device comprising the steps of:
   forming a silicone layer over a substrate;
   performing a plasma treatment to a surface of the silicone layer to form a brittle layer;

forming an organic compound layer over the brittle layer;
forming a gate electrode over the organic compound layer;
forming a gate insulating layer over the gate electrode;
forming a source and drain electrodes over the gate insulating layer;
forming a semiconductor layer over the source and drain electrodes and the gate insulating layer; and
after forming a semiconductor element using the gate electrode, the gate insulating layer, the source and drain electrodes, and the semiconductor layer, separating a stacked body including the organic compound layer and the semiconductor element from the substrate at the brittle layer.

10. A method for manufacturing a semiconductor device according to claim 9, wherein the semiconductor layer is an amorphous semiconductor layer.

11. A method for manufacturing a semiconductor device according to claim 9, wherein the semiconductor layer is a microcrystalline semiconductor layer.

12. A method for manufacturing a semiconductor device according to claim 9, wherein the semiconductor layer has an organic compound.

13. A method for manufacturing a semiconductor device according to claim 9, wherein the substrate is a glass substrate, a ceramic substrate, or a quartz substrate.

14. A method for manufacturing a semiconductor device according to claim 9, wherein the brittle layer is a silicon oxide layer.

15. A method for manufacturing a semiconductor device according to claim 9, wherein the semiconductor layer includes ZnO.

16. A method for manufacturing a semiconductor device according to claim 9, wherein the semiconductor layer includes an oxide of zinc-gallium-indium.

17. A method for manufacturing a semiconductor device comprising the steps of:
forming a silicone layer over a substrate;
performing a plasma treatment to a surface of the silicone layer to form a brittle layer;
forming an organic compound layer over the brittle layer;
forming a source and drain electrodes over the gate insulating layer;
forming a semiconductor layer over the source and drain electrodes and the insulating layer;
forming a gate insulating layer over the gate electrode;
forming a gate electrode over the organic compound layer; and
after forming a semiconductor element using the source and drain electrodes, the semiconductor layer, the gate insulating layer, and the gate electrode, separating a stacked body including the organic compound layer and the semiconductor element from the substrate at the brittle layer.

18. A method for manufacturing a semiconductor device according to claim 17, wherein the semiconductor layer is an amorphous semiconductor layer.

19. A method for manufacturing a semiconductor device according to claim 17, wherein the semiconductor layer is a microcrystalline semiconductor layer.

20. A method for manufacturing a semiconductor device according to claim 17, wherein the semiconductor layer has an organic compound.

21. A method for manufacturing a semiconductor device according to claim 17, wherein the substrate is a glass substrate, a ceramic substrate, or a quartz substrate.

22. A method for manufacturing a semiconductor device according to claim 17, wherein the brittle layer is a silicon oxide layer.

23. A method for manufacturing a semiconductor device according to claim 17, wherein the semiconductor layer includes ZnO.

24. A method for manufacturing a semiconductor device according to claim 17, wherein the semiconductor layer includes an oxide of zinc-gallium-indium.

* * * * *